US011189570B2

(12) United States Patent
Kim et al.

(10) Patent No.: US 11,189,570 B2
(45) Date of Patent: Nov. 30, 2021

(54) INTEGRATED CIRCUIT (IC) DEVICE

(71) Applicant: Samsung Electronics Co., Ltd., Suwon-si (KR)

(72) Inventors: Jin-a Kim, Hwaseong-si (KR); Yong-kwan Kim, Yongin-si (KR); Se-keun Park, Suwon-si (KR); Ho-in Ryu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 5 days.

(21) Appl. No.: 16/674,049

(22) Filed: Nov. 5, 2019

(65) Prior Publication Data
US 2020/0194374 A1    Jun. 18, 2020

(30) Foreign Application Priority Data

Dec. 17, 2018 (KR) .......................... 10-2018-0163310

(51) Int. Cl.
*H01L 23/535* (2006.01)
*H01L 27/108* (2006.01)

(52) U.S. Cl.
CPC ...... *H01L 23/535* (2013.01); *H01L 27/10814* (2013.01)

(58) Field of Classification Search
CPC ............ H01L 23/535; H01L 27/10814; H01L 27/10885; H01L 21/76843; H01L 21/76856; H01L 21/76864; H01L 21/76897; H01L 27/10847
See application file for complete search history.

(56) References Cited

U.S. PATENT DOCUMENTS

| 6,348,375 | B1 * | 2/2002 | Lee ................... H01L 27/10888 |
| | | | 438/253 |
| 6,589,837 | B1 * | 7/2003 | Ban ................... H01L 27/10814 |
| | | | 257/E21.649 |
| 9,337,203 | B2 | 5/2016 | Hwang et al. |
| 9,356,073 | B1 | 5/2016 | Kim |
| 9,379,004 | B1 | 6/2016 | Kwon et al. |
| 9,419,000 | B2 | 8/2016 | Kim et al. |
| 9,425,200 | B2 | 8/2016 | Hwang et al. |
| 9,508,649 | B2 | 11/2016 | Lee et al. |

(Continued)

FOREIGN PATENT DOCUMENTS

KR    10-2017-0126072 A    11/2017
KR    10-2018-0018239 A    2/2018

*Primary Examiner* — Bitew A Dinke
(74) *Attorney, Agent, or Firm* — Muir Patent Law, PLLC

(57) ABSTRACT

An integrated circuit (IC) device includes a line structure including a conductive line formed on a substrate and an insulation capping pattern that covers the conductive line; an insulation spacer covering a sidewall of the line structure; a conductive plug spaced apart from the conductive line in a first horizontal direction with the insulation spacer between the conductive plug and the conductive line; a conductive landing pad arranged on the conductive plug to vertically overlap the conductive plug; and a capping layer including a first portion between the conductive landing pad and the insulation capping pattern, wherein the first portion of the capping layer has a shape in which a width in the first horizontal direction gradually increases as a distance from the substrate increases between the conductive landing pad and the insulation capping pattern.

20 Claims, 37 Drawing Sheets

(56) References Cited

U.S. PATENT DOCUMENTS

| | | | |
|---|---|---|---|
| 9,837,490 B2 | 12/2017 | Park et al. | |
| 2007/0007656 A1* | 1/2007 | Yoon | H01L 28/91 |
| | | | 257/758 |
| 2012/0007165 A1* | 1/2012 | Lee | H01L 29/40114 |
| | | | 257/316 |
| 2015/0061136 A1* | 3/2015 | Yoo | H01L 21/76831 |
| | | | 257/755 |
| 2015/0162335 A1* | 6/2015 | Kim | H01L 27/10876 |
| | | | 257/773 |
| 2015/0214146 A1* | 7/2015 | Kim | H01L 27/10855 |
| | | | 257/741 |
| 2015/0214291 A1* | 7/2015 | Park | H01L 24/08 |
| | | | 257/503 |
| 2015/0262625 A1* | 9/2015 | Han | H01L 21/764 |
| | | | 257/773 |
| 2015/0340281 A1* | 11/2015 | Lee | H01L 21/76895 |
| | | | 438/5 |
| 2015/0380508 A1* | 12/2015 | Kim | H01L 27/10888 |
| | | | 257/742 |
| 2016/0064384 A1* | 3/2016 | Park | H01L 27/10814 |
| | | | 257/368 |
| 2016/0300763 A1* | 10/2016 | Kim | H01L 21/76897 |
| 2017/0005097 A1* | 1/2017 | Kim | H01L 21/7682 |
| 2017/0125283 A1* | 5/2017 | Lee | H01L 27/10814 |
| 2017/0323893 A1 | 11/2017 | Kim et al. | |
| 2018/0012894 A1* | 1/2018 | Kim | H01L 27/10814 |
| 2018/0019244 A1* | 1/2018 | Kim | H01L 21/76224 |
| 2018/0019245 A1 | 1/2018 | Yang et al. | |
| 2018/0040560 A1* | 2/2018 | Kim | H01L 21/764 |
| 2019/0206876 A1* | 7/2019 | Yuki | H01L 27/10847 |

\* cited by examiner

A – A'

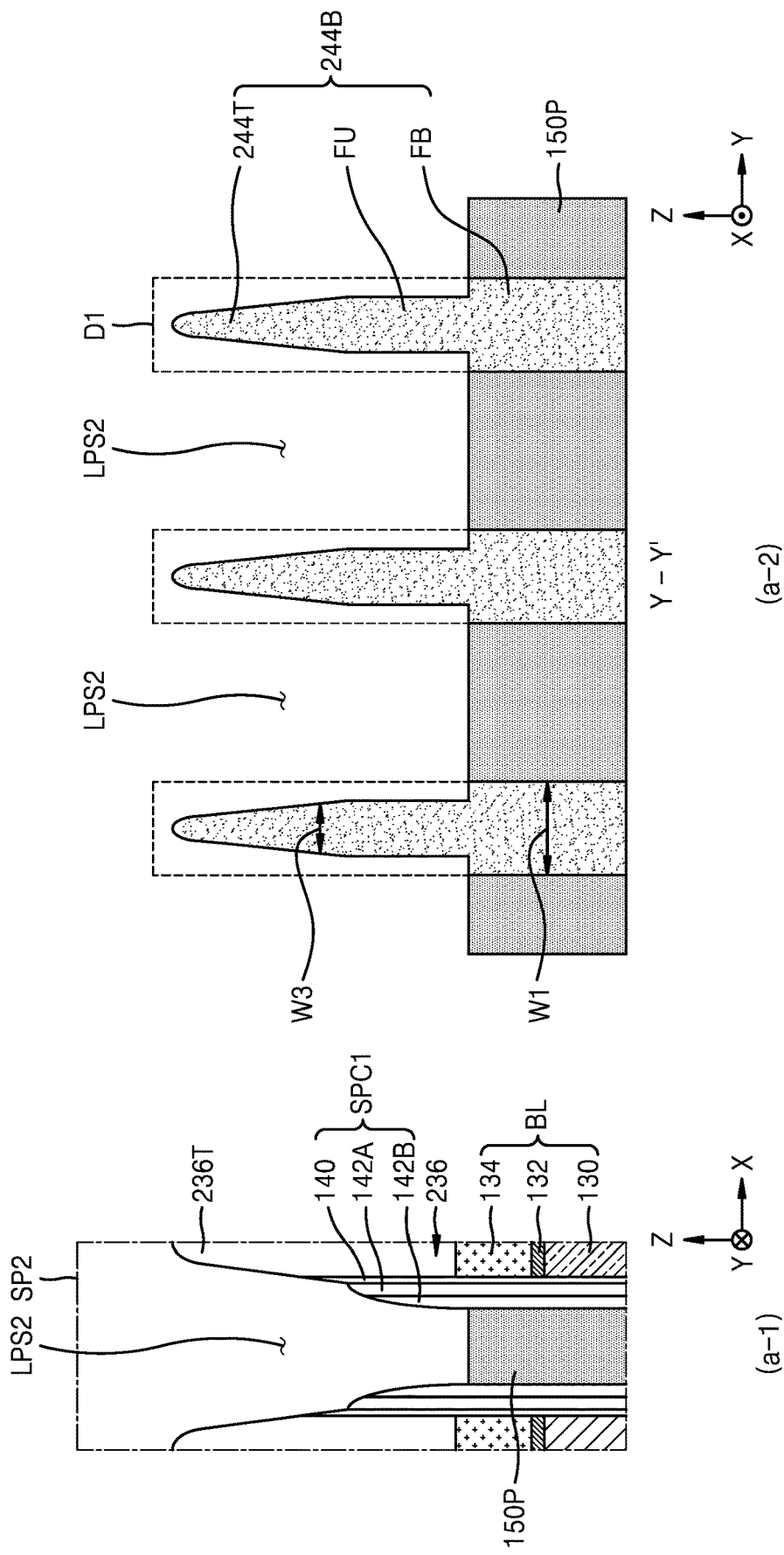

INTEGRATED CIRCUIT (IC) DEVICE

CROSS-REFERENCE TO RELATED APPLICATION

This application claims the benefit of Korean Patent Application No. 10-2018-0163310, filed on Dec. 17, 2018, in the Korean Intellectual Property Office, the disclosure of which is incorporated herein in its entirety by reference.

BACKGROUND

The inventive concept relates to integrated circuit (IC) devices, and more particularly, to an IC device including a plurality of conductive patterns that are adjacent to each other.

Recently, as down-scaling of IC devices rapidly progresses, gaps between a plurality of wiring lines decrease. Therefore, there is a need to develop an IC device having a structure which may prevent occurrence of an unwanted short circuit between conductive patterns arranged with high density within a limited area.

SUMMARY

The inventive concept provides an integrated circuit (IC) device having a structure which may improve reliability by preventing occurrence of a short circuit by ensuring a sufficient insulation distance between a plurality of conductive patterns formed within a limited area in an IC device having a smaller unit cell size due to down-scaling of the IC device.

According to some aspects, the disclosure is directed to an integrated circuit (IC) device comprising: a line structure comprising a conductive line formed on a substrate and an insulation capping pattern that covers the conductive line; an insulation spacer covering a sidewall of the line structure; a conductive plug spaced apart from the conductive line in a first horizontal direction with the insulation spacer between the conductive plug and the conductive line; a conductive landing pad arranged on the conductive plug to vertically overlap the conductive plug; and a capping layer comprising a first portion between the conductive landing pad and the insulation capping pattern, wherein the first portion of the capping layer has a shape between the conductive landing pad and the insulation capping pattern in which a width in the first horizontal direction gradually increases as a distance from the substrate increases in a vertical direction.

According to some aspects, the disclosure is directed to an integrated circuit (IC) device comprising: a pair of line structures comprising a pair of conductive lines extending parallel to each other on a substrate and being adjacent to each other in a first horizontal direction and a pair of insulation capping patterns covering the pair of conductive lines; a conductive plug interposed between the pair of line structures; a conductive landing pad arranged on the conductive plug between the pair of line structures; and a capping layer comprising a first portion between one of the pair of line structures and the conductive landing pad, wherein the first portion of the capping layer has a shape between the one of the pair of line structures and the conductive landing pad in which a width in the first horizontal direction gradually increases as a distance from the substrate increases in a vertical direction.

According to some aspects, the disclosure is directed to an integrated circuit (IC) device comprising: a pair of line structures comprising a pair of conductive lines extending parallel to each other on a substrate and being adjacent to each other in a first horizontal direction and a pair of insulation capping patterns covering the pair of conductive lines; a plurality of contact structures interposed between the pair of line structures and aligned in a second horizontal direction perpendicular to the first horizontal direction; a plurality of insulation fences alternating with the plurality of contact structures between the pair of line structures such that one insulation fence is between two adjacent contact structures; and a capping layer comprising a first portion between one of the pair of line structures and one of the plurality of contact structures, wherein the first portion of the capping layer has a shape between the one of the pair of line structures and the plurality of contact structures in which a width in the first horizontal direction gradually increases as a distance from the substrate increases in a vertical direction.

BRIEF DESCRIPTION OF THE DRAWINGS

Embodiments of the inventive concept will be more clearly understood from the following detailed description taken in conjunction with the accompanying drawings in which:

FIGS. 12A through 15B are cross-sectional views for explaining a method of manufacturing an IC device, according to other example embodiments of the inventive concept, wherein FIGS. 12A, 13A, 14A, and 15A are cross-sectional views of some components of portions corresponding to the cross-section taken along line A-A' of FIG. 1, respectively, and FIGS. 12B, 13B, 14B, and 15B are cross-sectional views of some components of resultant structures obtained in the respective processes of FIGS. 12A, 13A, 14A, and 15A, respectively.

DETAILED DESCRIPTION OF THE EMBODIMENTS

Figure 1:
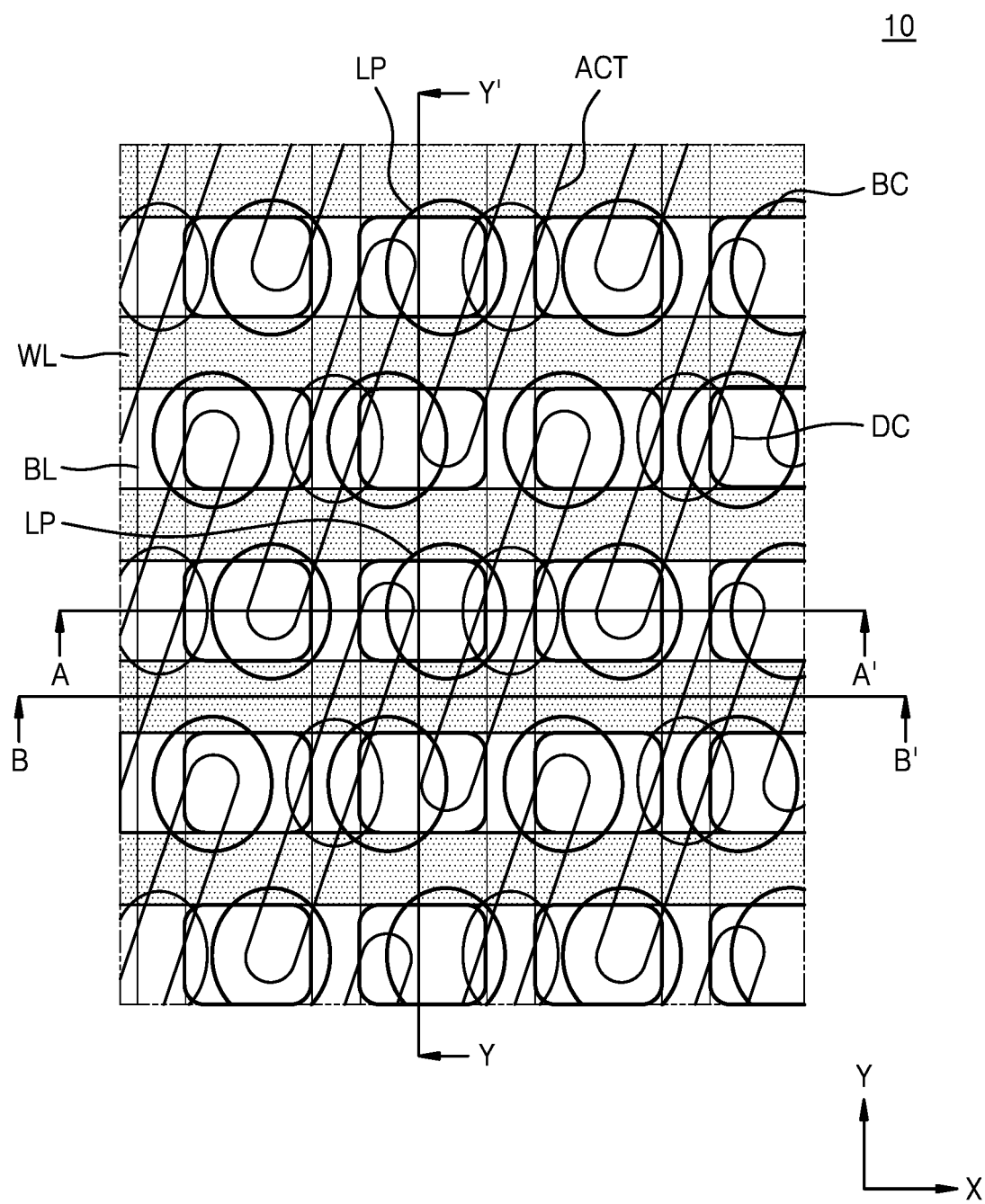
FIG. 1 is a schematic planar layout for explaining main components of a memory cell array region of an integrated circuit (IC) device, according to some example embodiments of the inventive concept.

Embodiments will now be described more fully with reference to the accompanying drawings. In the accompanying drawings, like reference numerals may refer to like elements, and repeated descriptions of the like elements will be omitted.

FIG. 1 is a schematic planar layout for explaining main components of a memory cell array region of an integrated circuit (IC) device 10, according to some example embodiments of the inventive concept.

Referring to FIG. 1, in the IC device 10, a plurality of active regions ACT may be arranged to extend lengthwise in an oblique direction with respect to an X direction and a Y direction on a plane. A plurality of word lines WL may extend lengthwise in parallel to each other in the X direction across the plurality of active regions ACT. On the plurality of word lines WL, a plurality of bit lines BL may extend lengthwise in parallel to each other in the Y direction intersecting with the X direction. The plurality of bit lines BL may be connected to the plurality of active regions ACT via direct contacts DC. An item, layer, or portion of an item or layer described as extending "lengthwise" in a particular direction has a length in the particular direction and a width perpendicular to that direction, where the length is greater than the width.

A plurality of buried contacts BC may be formed between two bit lines BL adjacent to each other among the plurality of bit lines BL. A plurality of conductive landing pads LP may be formed on the plurality of buried contacts BC. The plurality of buried contacts BC and the plurality of conductive landing pads LP may connect bottom electrodes (not shown) of capacitors formed over the plurality of bit lines BL to the active regions ACT. Each of the plurality of conductive landing pads LP may be arranged to at least partially overlap a buried contact BC.

Figure 2A:
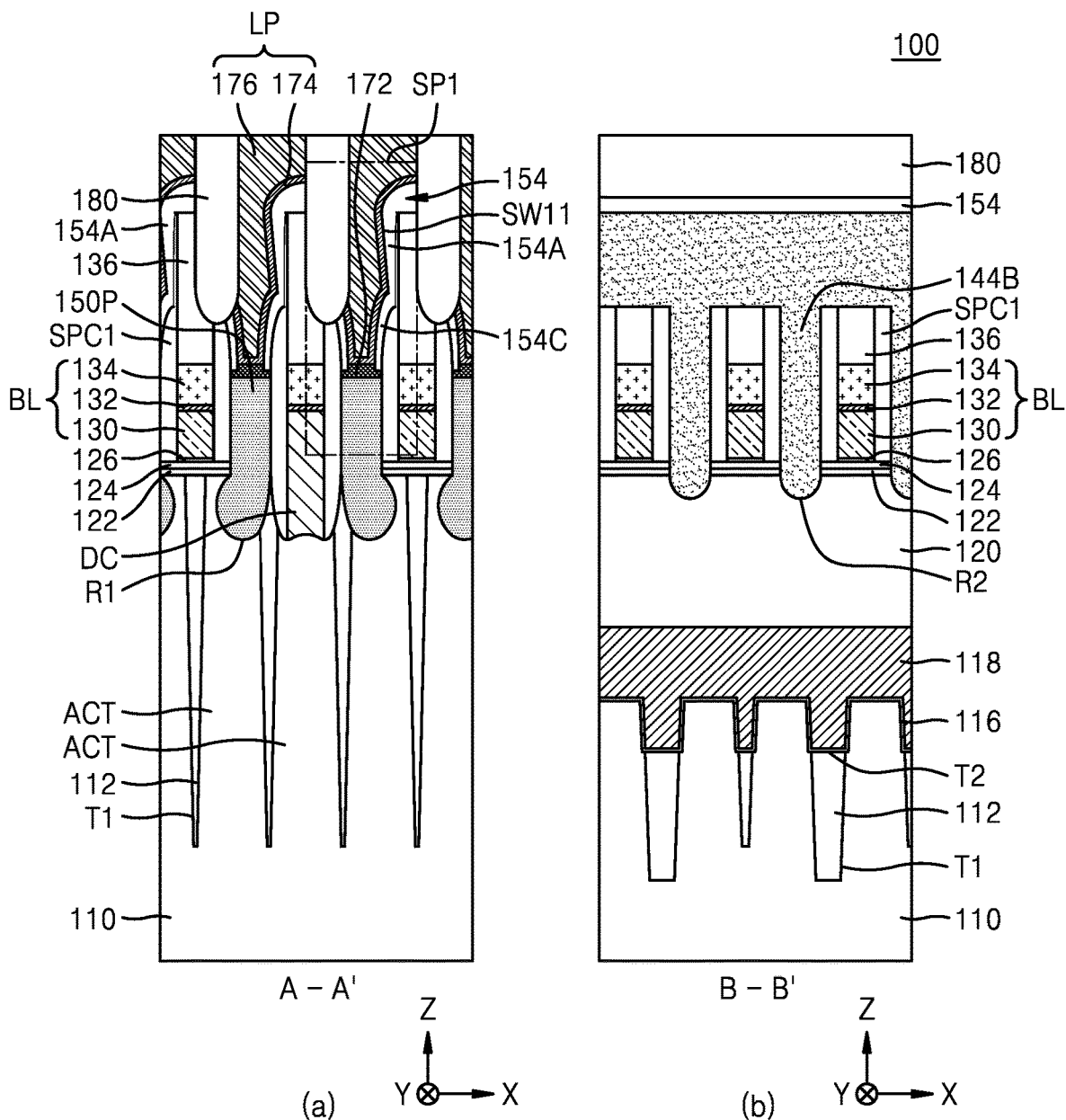
FIG. 2A is a cross-sectional view for explaining an IC device, according to example embodiments of the inventive concept.
Figure 2B:
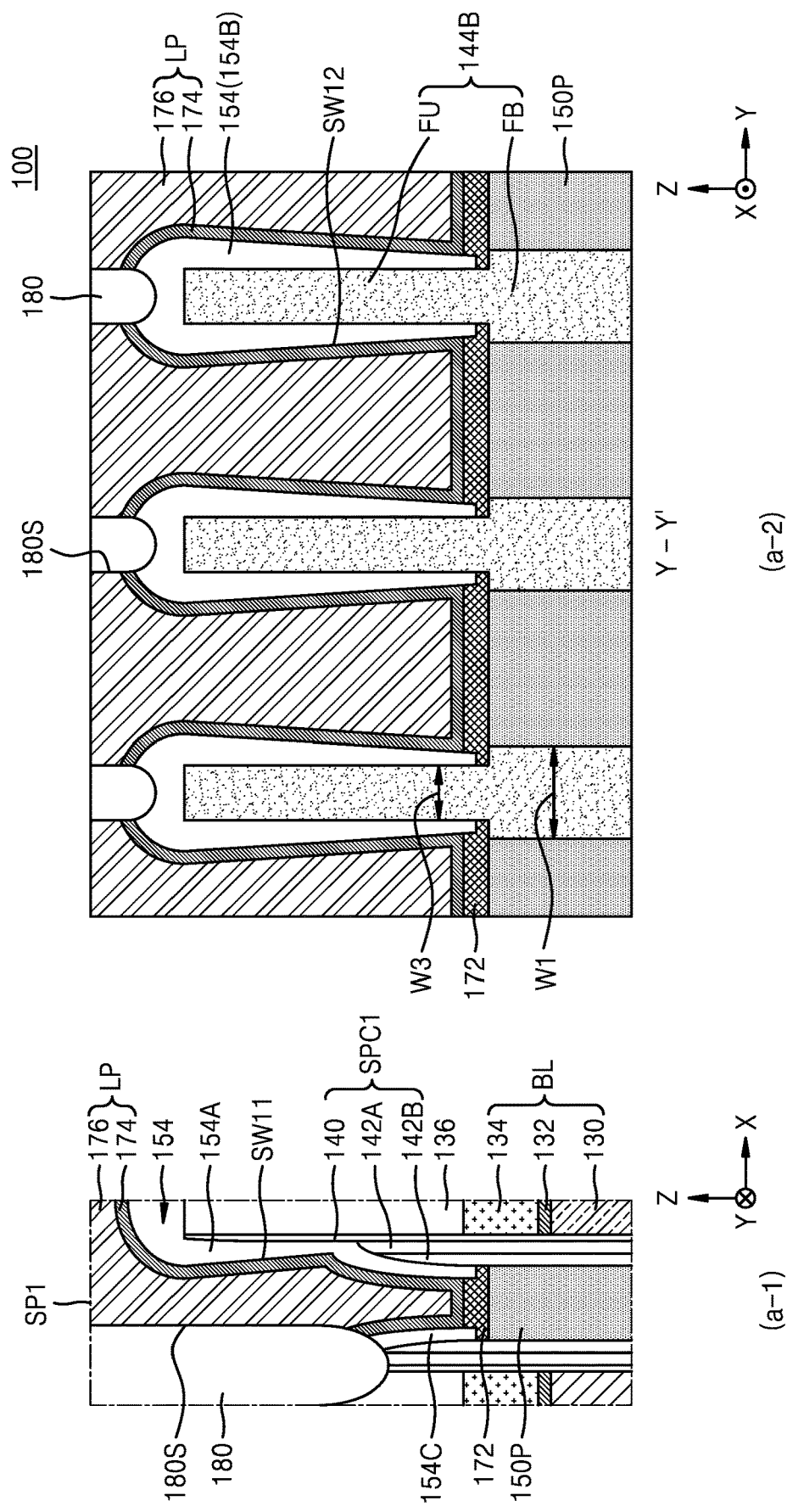
FIG. 2B is a cross-sectional view of an enlargement of some regions of FIG. 2A.

FIG. 2A is a cross-sectional view for explaining an IC device, according to example embodiments of the inventive concept, and FIG. 2B is a cross-sectional view of an enlargement of some regions of FIG. 2A. In FIG. 2A, (a) is a cross-sectional view of some components of a portion corresponding to the cross-section taken along line A-A' of FIG. 1, and (b) is a cross-sectional view of some components of a portion corresponding to the cross-section taken along line B-B' of FIG. 1. In FIG. 2B, (a-1) is a magnified cross-sectional view of a dashed-dotted line region SP1 in FIG. 2A, and (a-2) is a magnified cross-sectional view of some components of a portion in a Y direction of the dashed-dotted line region SP1 in FIG. 2A, for example, a portion corresponding to the cross-section taken along line Y-Y' of FIG. 1.

An IC device 100 shown in FIGS. 2A and 2B may constitute a portion of the IC device 10 shown in FIG. 1. The IC device 100 includes a substrate 110 in which a plurality of active regions ACT are defined by an isolation layer 112. The isolation layer 112 is formed within an isolation trench T1 formed in the substrate 110.

According to some embodiments, the substrate 110 may include silicon, for example, single-crystalline silicon, polycrystalline silicon, or amorphous silicon. According to some other embodiments, the substrate 110 may include at least one selected from among Ge, SiGe, SiC, GaAs, InAs, and InP. According to some embodiments, the substrate 110 may include a conductive region, for example, an impurity-doped well or an impurity-doped structure.

A plurality of word line trenches T2, each extending lengthwise in a first horizontal direction (X direction), are formed in the substrate 110, and a plurality of gate dielectric layers 116, a plurality of word lines 118, and a buried insulation layer 120 are formed within the plurality of word line trenches T2. The plurality of word lines 118 may correspond to the plurality of word lines WL of FIG. 1. A plurality of second recess spaces R2 may be formed in an upper surface of the buried insulation layer 120.

A first insulation layer 122, a second insulation layer 124, and a third insulation layer 126 are formed on the substrate 110 in this stated order. A width of the third insulation layer 126 in the X direction may be less than a width of each of the first insulation layer 122 and the second insulation layer 124 in the X direction. According to some embodiments, each of the first, second, and third gate insulation layers 122, 124, and 126 may include an oxide layer, a nitride layer, or a combination thereof. For example, the first insulation layer 122 and the third insulation layer 126 may each include a silicon oxide layer, and the second insulation layer 124 may include a silicon nitride layer, but the inventive concept is not limited thereto.

A plurality of direct contacts DC may be arranged on respective portions of the plurality of active regions ACT, respectively. A plurality of line structures including a plurality of conductive lines may each extend in a second horizontal direction (Y direction) on the third insulation layer 126 and the plurality of direct contacts DC. The plurality of conductive lines included in the plurality of line structures may be the plurality of bit lines BL. The plurality of line structures may include the plurality of bit lines BL and a plurality of insulation capping patterns 136 covering the plurality of bit lines BL. A plurality of conductive plugs 150P and a plurality of insulation fences 144B may be aligned in the Y direction between a pair of line structures each including the bit lines BL and the insulation capping patterns 136 adjacent to each other from among the plurality of line structures. The plurality of insulation fences 144B may fill the plurality of second recess spaces R2 formed in the upper surface of the buried insulation layer 120 and may alternate with the plurality of conductive plugs 150P such that one insulation fence 144B is between two adjacent conductive plugs 150P. Respective both sidewalls of the plurality of conductive plugs 150P in the Y direction may be covered by the plurality of insulation fences 144B. The plurality of conductive plugs 150P aligned in the Y direction may be insulated from each other by the plurality of insulation fences 144B. The plurality of conductive plugs 150P may constitute the plurality of buried contacts BC of FIG. 1.

A plurality of contact structures each including a conductive plug 150P between the pair of line structures adjacent to each other from among the plurality of line structures may each extend in a column shape in a vertical direction (Z direction). Each of the plurality of contact structures may include a conductive plug 150P, a conductive landing pad LP, and a metal silicide layer 172 between the conductive plug 150P and the conductive landing pad LP. For example, a bottom surface of the metal silicide layer 172 may contact a top surface of the conductive plug 150P, and a top surface of the metal silicide layer 172 may contact a bottom surface of the conductive landing pad LP.

The plurality of bit lines BL may be connected to the active regions ACT via the direct contacts DC. One direct contact DC, and a pair of conductive plugs 150P facing each other with the direct contact DC therebetween may be connected to different active regions ACT from among the plurality of active regions ACT. According to some embodiments, the direct contacts DC may include Si, Ge, W, WN, Co, Ni, Al, Mo, Ru, Ti, TiN, Ta, TaN, Cu, or a combination thereof. According to some embodiments, each direct contact DC may include an epitaxial silicon layer. In some embodiments, a bottom surface of each direct contacts DC may have a convex shape with respect to the substrate 110.

Each of the plurality of bit lines BL may include a lower conductive layer 130, an intermediate conductive layer 132, and an upper conductive layer 134 formed on the substrate 110 in this stated order. For example, the lower conductive layer 130 may be formed on the third insulation layer 126, the intermediate conductive layer 132 may be formed on the lower conductive layer 130, and the upper conductive layer 134 may be formed on the intermediate conductive layer 132. An upper surface of the lower conductive layer 130 and an upper surface of the direct contact DC may extend on the same horizontal plane. Although each of the plurality of bit lines BL has a three-layered structure including the lower conductive layer 130, the intermediate conductive layer 132, and the upper conductive layer 134 in FIG. 2A, the inventive concept is not limited thereto. For example, each of the plurality of bit lines BL may be formed as a single layer, a double layer, or a stack of a plurality of layers, such as four or more layers. According to some embodiments, the lower conductive layer 130 may include conductive polysilicon. Each of the intermediate conductive layer 132 and the upper conductive layer 134 may include TiN, TiSiN, W, W silicide, or a combination thereof. For example, the intermediate conductive layer 132 may include TiN and/or TiSiN, and the upper conductive layer 134 may be tungsten (W). The insulation capping pattern 136 may be a silicon nitride layer.

The plurality of conductive plugs 150P may each have a column shape extending in the vertical direction (Z direction) in spaces between the plurality of bit lines BL on the substrate 110. A lower surface of each of the plurality of conductive plugs 150P may contact an active region ACT. A portion of each of the plurality of conductive plugs 150P may be on a lower level than an upper surface of the substrate 110 so as to be buried within the substrate 110. The plurality of contact plugs 150P may each include, but are not limited to, an impurity-doped semiconductor material, metal, conductive metal nitride, or a combination thereof.

The plurality of insulation fences 144B may each have a column shape extending in the vertical direction (Z direction) in spaces between the plurality of bit lines BL on the substrate 110. Each of the plurality of insulation fences 144B may include a fence base FB having side walls covered by conductive plugs 150P, and a fence upper portion FU protruding above an upper surface of each of the plurality of conductive plugs 150P. In the Y direction, a width W1 of the fence base FB may be greater than a width W3 of the fence upper portion FU. In the X direction, the fence base FB and the fence upper portion FU may have substantially the same widths as each other or similar widths to each other. According to some embodiments, the plurality of insulation fences 144B may include, but are not limited to, silicon nitride layers. Sidewalls of the fence base FB and the fence upper portion FU may be substantially vertical, and may be perpendicular to the top surface of the substrate 110.

The IC device 100 may include a plurality of insulation spacers SPC1 that cover respective sidewalls of the plurality of line structures each including the bit lines BL and the insulation capping patterns 136. The plurality of insulation spacers SPC1 may cover respective both sidewalls of the plurality of bit lines BL, respective both sidewalls of the plurality of insulation capping patterns 136, and respective both sidewalls of the plurality of direct contacts DC. For example, the insulation spacers SPC1 may contact both sidewalls of the plurality of bit lines BL, both sidewalls of the plurality of insulation capping patterns 136, and both sidewalls of the plurality of direct contacts DC. The plurality of insulation spacers SPC1 may each extend parallel to the plurality of bit lines BL in the Y direction to cover the respective both sidewalls of the plurality of bit lines BL. Top surfaces of the insulation spacers SPC1 may be at the same vertical level as top surfaces of the plurality of insulation capping patterns 136. Each of the plurality of insulation spacers SPC1 may be an oxide layer, a nitride layer, an air spacer, or a combination thereof. The term "air" used herein may mean a space including the atmospheric air, or other gases that may exist during a manufacturing process.

According to some embodiments, as shown in (a-1) of FIG. 2B, each of the plurality of insulation spacers SPC1 may include an insulation liner 140, a first insulation spacer 142A, and a second insulation spacer 142B that cover a sidewall of each bit line BL in this stated order. In some embodiments, the insulation liner 140 may contact entire sidewalls of the plurality of bit lines BL, entire sidewalls of the plurality of insulation capping patterns 136, and entire sidewalls of the plurality of direct contacts DC. The first insulation spacer 142A may be formed on at least a portion of each outside sidewall of the insulation liner 140, and the second insulation spacer 142B may be formed on the first insulation spacer 142A. The insulation liner 140 may be a silicon nitride layer. The first insulation spacer 142A may be a silicon oxide layer or an air spacer. The second insulation spacer 142B may be a silicon nitride layer. The insulation liner 140, the first insulation spacer 142A, and the second insulation spacer 142B may extend parallel to the bit line BL between the bit line BL and a plurality of conductive plugs 150P and between the bit line BL and a plurality of insulation fences 144B.

The plurality of conductive plugs 150P aligned in the Y direction may be spaced apart from the bit lines BL in the X direction with the insulation spacers SPC1 therebetween. The plurality of insulation fences 144B aligned in the Y direction may be spaced apart from the bit lines BL in the X direction with the insulation spacers SPC1 therebetween.

The plurality of metal silicide layers 172 and the plurality of conductive landing pads LP may be sequentially formed on the plurality of conductive plugs 150P to constitute the plurality of contact structures. In the plurality of contact structures, the metal silicide layers 172 and the conductive landing pads LP may be arranged to vertically overlap the conductive plugs 150P.

The plurality of metal silicide layers 172 may be interposed between the plurality of conductive plugs 150P and the plurality of conductive landing pads LP, respectively, and may be spaced apart from the bit lines BL with insulation spacers SPC1 therebetween in the X direction. According to some embodiments, each metal silicide layer 172 may include, but is not limited to, cobalt silicide, nickel silicide, or manganese silicide.

The plurality of conductive landing pads LP may be connected to the plurality of conductive plugs 150P via the plurality of metal silicide layers 172, respectively. The plurality of conductive landing pads LP may extend from spaces between the plurality of insulation capping patterns 136 to spaces over the plurality of upper insulation fences FU so as to vertically overlap respective portions of the plurality of bit lines BL. Each of the plurality of conductive landing pads LP may include a conductive barrier layer 174 and a conductive layer 176. The conductive barrier layer 174 may include Ti, TiN, or a combination thereof. The conductive layer 176 may include metal, metal nitride, conductive polysilicon, or a combination thereof. For example, the conductive layer 176 may be tungsten (W).

The plurality of conductive landing pads LP may be in the shape of a plurality of island-type patterns in a plan view. The plurality of conductive landing pads LP may be electrically insulated from each other by an insulation layer 180 that fills insulation spaces 180S around the plurality of conductive landing pads LP. The insulation layer 180 may include a silicon nitride layer, a silicon oxide layer, or a combination thereof.

According to some embodiments, an interval between two conductive landing pads LP adjacent to each other in the Y direction from among the plurality of conductive landing pads LP may be less than that between two conductive landing pads LP adjacent to each other in the X direction from among the plurality of conductive landing pads LP. Accordingly, a depth (see (a-2) of FIG. 2B) of an insulation space 180S between the two conductive landing pads LP adjacent to each other in the Y direction may be less than a depth (see (a) of FIG. 2A) of an insulation space 180S between the two conductive landing pads LP adjacent to each other in the X direction. Accordingly, a lower surface level of the insulation layer 180 that fills the insulation spaces 180S may vary according to locations on the substrate 110. As illustrated in FIG. 2B, a level of a lower surface of a portion of the insulation layer 180 that vertically overlaps each insulation fence 144B may be higher than that of a lower surface of a portion of the insulation layer 180 that vertically overlaps each insulation capping pattern 136.

The plurality of line structures, each including the bit lines BL and the insulation capping patterns 136, may be covered by a capping layer 154. The capping layer 154 may include, but is not limited to, silicon nitride ($Si_3N_4$), silicon carbonitride (SiCN), or a combination thereof. The capping layer 154 may also be referred to herein as an improper-fraction type capping layer 154.

As illustrated in (a) of FIG. 2A and (a-1) of FIG. 2B, the improper-fraction type capping layer 154 may include a first portion 154A interposed between each conductive landing pad LP and each insulation capping pattern 136. For example, the first portion 154A of the improper-fraction type capping layer 154 may be formed on outer sidewalls of the insulation liner 140 at locations where the insulation liner 140 extends above the first and second insulation spacers 142A and 142B. The first portion 154A may contact portions of the outer sidewalls of the insulation liner 140 and top surfaces of each insulation capping pattern 136. The first portion 154A of the improper-fraction type capping layer 154 between each conductive landing pad LP and each insulation capping pattern 136 may gradually increase in a width in the X direction as a distance from the substrate 110 increases in the Z direction.

As illustrated in (a-2) of FIG. 2B, the improper-fraction type capping layer 154 may include a second portion 154B interposed between each conductive landing pad LP and each insulation fence 144B. For example, the second portion 154B may contact top surfaces and portions of the sidewalls of each upper insulation fence 144B. The second portion 154B of the improper-fraction type capping layer 154 may cover sidewalls of each conductive landing pad LP in the Y direction and may gradually increase in a width in the Y direction as the distance from the substrate 110 increases in the Z direction.

As illustrated in (a) of FIG. 2A and (a-1) of FIG. 2B, the improper-fraction type capping layer 154 may include a third portion 154C interposed between each conductive landing pad LP and each insulation spacer SPC1. For example, the third portion 154C of the improper-fraction type capping layer 154 may be formed on and contact portions of the outer and upper sidewalls of the first and second insulation spacers 142A and 142B. The width in the X direction of the first portion 154A of the improper-fraction type capping layer 154 may be greater than that of the third portion 154C of the improper-fraction type capping layer 154. The third portion 154C of the improper-fraction type capping layer 154 may be interposed between each bit line BL and each conductive landing pad LP. A portion of each conductive landing pad LP may be spaced apart from each bit line BL with the third portion 154C of the improper-fraction type capping layer 154 and each insulation spacer SPC1 therebetween.

At least a portion of each metal silicide layer 172 may be spaced apart from each bit line BL with the third portion 154C of the improper-fraction type capping layer 154 and each insulation spacer SPC1 therebetween. The third portion 154C of the improper-fraction type capping layer 154 may be spaced apart from each conductive plug 150P with each metal silicide layer 172 therebetween. A bottom surface of the third portion 154C may be at a lower vertical height than a top surface of the metal silicide layer 172 and may be at a higher vertical height than a bottom surface of the metal silicide layer 172. Some portions of the metal silicide layer 172 may be interposed respectively between bottom surfaces of the third portion 154C and top surfaces of the fence base FB, and other portions of the metal silicide layer 172 may be interposed respectively between bottom surfaces of the third portion 154C and top surfaces of the conductive plugs 150P.

Each of the plurality of conductive landing pads LP may include a portion of which at least one of widths in the horizontal direction (e.g., a width in the X direction and a width in the Y direction) decreases as the distance from the substrate 110 increases in the Z direction. As illustrated in (a) of FIG. 2A and (a-1) of FIG. 2B, each of the plurality of conductive landing pads LP may have a first sidewall SW11 facing the first portion 154A of the improper-fraction type capping layer 154, and a separation distance between the first sidewall SW11 and each insulation capping pattern 136 may gradually increase as the distance from the substrate 110 increases. As illustrated in (a-2) of FIG. 2B, each of the plurality of conductive landing pads LP may have a second sidewall SW12 facing the second portion 154B of the improper-fraction type capping layer 154, and a separation distance between the second sidewall SW12 and each insulation fence 144B may gradually increase as the distance from the substrate 110 increases.

In the IC device 100 of FIGS. 2A and 2B, an insulation structure including each insulation capping pattern 136 and the improper-fraction type capping layer 154 may be formed on each bit line BL, and thus a minimum critical dimension (CD) in the horizontal direction required by an insulation structure covering an upper surface of the bit line BL may be easily secured. Accordingly, even when portions of the insulation capping patterns 136 and the improper-fraction type capping layer 154 are consumed while neighboring layers of each of the insulation capping patterns 136 and the improper-fraction type capping layer 154 are being etched in a subsequent process, because a sufficient insulation space is secured between the plurality of bit lines BL, the plurality of metal silicide layers 172, the plurality of conductive landing pads LP, and other conductive patterns by the insulation capping patterns 136 and the improper-fraction type capping layer 154, occurrence of an unwanted short circuit may be prevented. Moreover, because the insulation spacers SPC1 covering respective both sidewalls of the plurality of bit lines BL are covered by the improper-fraction type capping layer 154, a sufficient insulation distance may be secured between the plurality of conductive landing pads LP and the bit lines BL adjacent thereto by the insulation spacers SPC1 and the improper-fraction type capping layer 154. Accordingly, occurrence of an unwanted short circuit between each conductive landing pad LP and each bit line BL may be prevented.

Figure 3A:
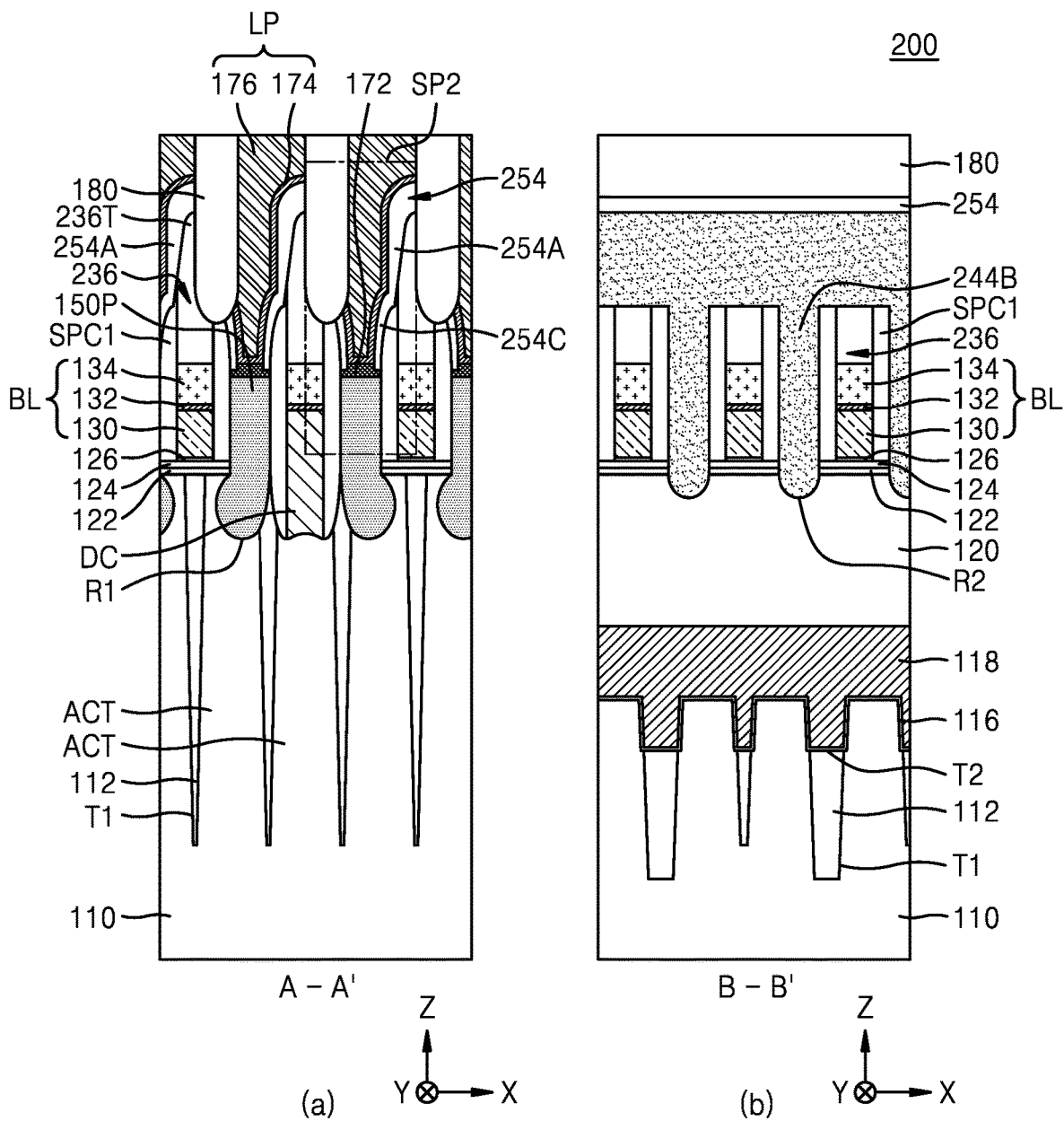
FIG. 3A is a cross-sectional view for explaining an IC device, according to example embodiments of the inventive concept.
Figure 3B:
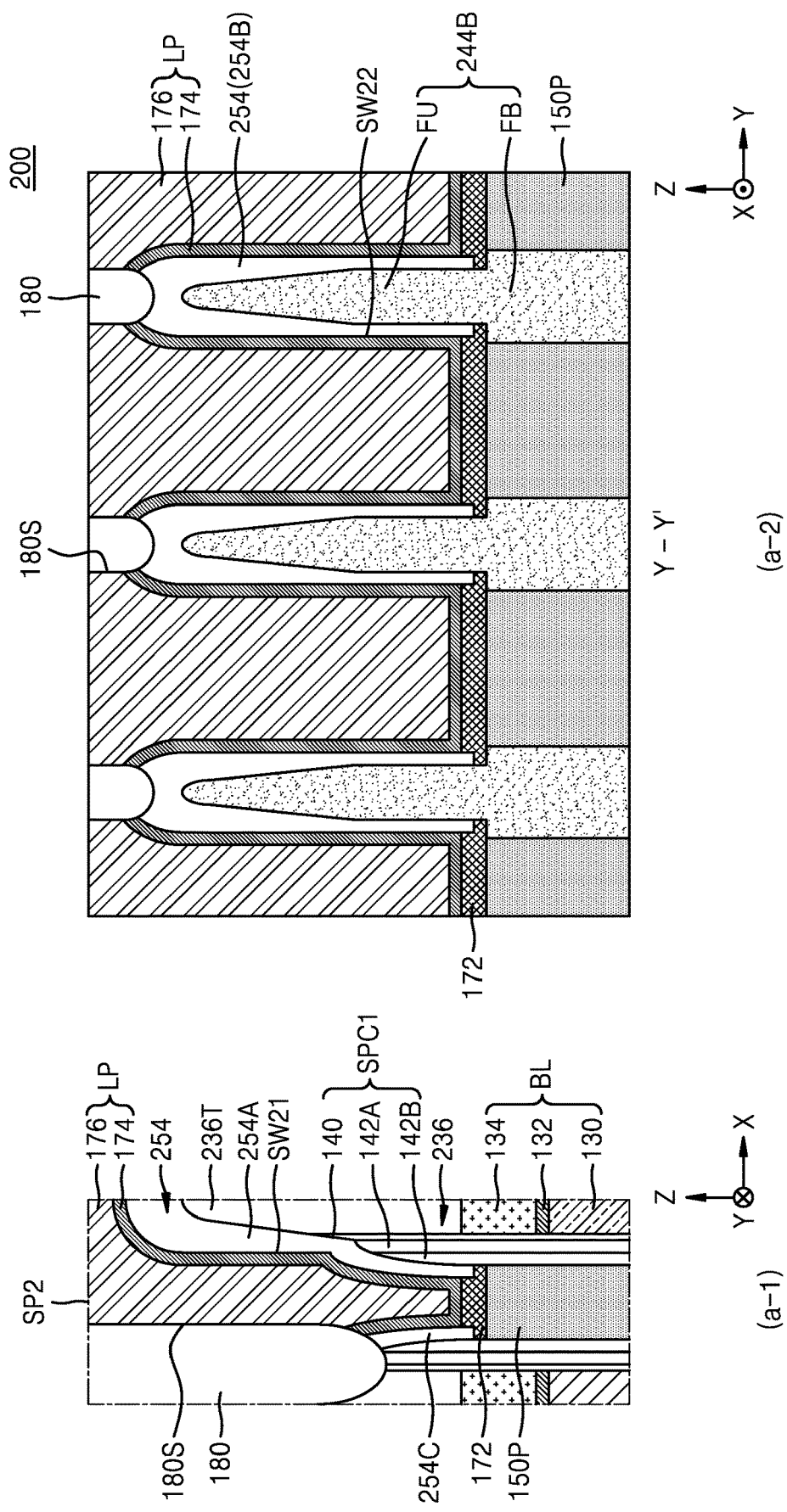
FIG. 3B is a cross-sectional view of an enlargement of some regions of FIG. 3A.

FIG. 3A is a cross-sectional view for explaining an IC device according to example embodiments of the inventive concept, and FIG. 3B is a cross-sectional view of an enlargement of some regions of FIG. 3A. In FIG. 3A, (a) is a cross-sectional view of some components of a portion corresponding to the cross-section taken along line A-A' of FIG. 1, and (b) is a cross-sectional view of some components of a portion corresponding to the cross-section taken along line B-B' of FIG. 1. In FIG. 3B, (a-1) is a magnified cross-sectional view of a dashed-dotted line region SP2 in (a) of FIG. 3A, and (a-2) is a magnified cross-sectional view of some components of a portion in the Y direction of the dashed-dotted line region SP2 in (a) of FIG. 3A, for example, a portion corresponding to the cross-section taken along line Y-Y' of FIG. 1. The same reference characters and numerals in FIGS. 3A and 3B as those in FIGS. 2A and 2B denote the same elements, and thus their description will be omitted herein.

An IC device 200 shown in FIGS. 3A and 3B may constitute a portion of the IC device 10 shown in FIG. 1. The IC device 200 has mostly the same structure as the IC device 100 of FIGS. 2A and 2B. However, the IC device 200 includes a plurality of insulation capping patterns 236 covering the plurality of bit lines BL. Each of the plurality of insulation capping patterns 236 includes a peak-type capping top 236T having a shape in which a width in the X direction gradually decreases with distance from the substrate 110. For example, a lower portion of each insulation capping pattern 236 may have sidewalls that are substantially vertical with respect to the top surface of the substrate 110, while the peak-type capping top 236T may have sidewalls that are at an angle with respect to the top surface of the substrate 110.

A plurality of line structures including the plurality of bit lines BL and the plurality of insulation capping patterns 236 may be covered by a capping layer 254. The capping layer 254 may include, but is not limited to, silicon nitride (Si₃N₄), silicon carbonitride (SiCN), or a combination thereof. The capping layer 254 may also be referred to herein as an improper-fraction type capping layer 254. As illustrated in (a) of FIG. 3A and (a-1) of FIG. 3B, the improper-fraction type capping layer 254 may include a first portion 254A interposed between each conductive landing pad LP and a peak-type capping top 236T of each insulation capping pattern 236. For example, the first portion 254A of the improper-fraction type capping layer 254 may be formed on outer sidewalls of the insulation liner 140 in locations where the insulation liner 140 extends above the first and second insulation spacers 142A and 142B. The first portion 254A may contact portions of the outer sidewalls of the insulation liner 140 and side and top surfaces of each peak-type capping top 236T. The first portion 254A of the improper-fraction type capping layer 254 between the conductive landing pad LP and the peak-type capping top 236T may gradually increase in a width in the X direction as the distance from the substrate 110 increase.

As illustrated in (a-2) of FIG. 3B, the improper-fraction type capping layer 254 may include a second portion 254B interposed between each conductive landing pad LP and each insulation fence 244B. For example, the second portion 254B may contact top surfaces and portions of the sidewalls of each upper insulation fence 244B. As illustrated in (a) of FIG. 3A and (a-1) of FIG. 3B, the improper-fraction type capping layer 254 may include a third portion 254C interposed between each conductive landing pad LP and each insulation spacer SPC1. For example, the third portion 254C of the improper-fraction type capping layer 254 may be formed on and contact portions of the outer and upper sidewalls of the first and second insulation spacers 142A and 142B. The width in the X direction of the first portion 254A of the improper-fraction type capping layer 254 may be greater than that of the third portion 254C of the improper-fraction type capping layer 254. The third portion 254C of the improper-fraction type capping layer 254 may be interposed between each bit line BL and each conductive landing pad LP. A portion of each conductive landing pad LP may be spaced apart from each bit line BL with the third portion 254C of the improper-fraction type capping layer 254 and each insulation spacer SPC1 therebetween.

At least a portion of each metal silicide layer 172 may be spaced apart from each bit line BL with the third portion 254C of the improper-fraction type capping layer 254 and each insulation spacer SPC1 therebetween. The third portion 254C of the improper-fraction type capping layer 254 may be spaced apart from each conductive plug 150P with each metal silicide layer 172 therebetween.

According to some embodiments, each of the plurality of conductive landing pads LP may include a portion of which at least one of widths in the horizontal direction (e.g., a width in the X direction and a width in the Y direction) decreases with distance from the substrate 110 in the Z direction. As illustrated in (a) of FIG. 3A and (a-1) of FIG. 3B, each of the plurality of conductive landing pads LP may have a first sidewall SW21 facing the first portion 254A of the improper-fraction type capping layer 254, and a separation distance between the first sidewall SW21 and each insulation capping pattern 236 may gradually increase as the distance from the substrate 110 increases. As illustrated in (a-2) of FIG. 3B, each of the plurality of conductive landing pads LP may have a second sidewall SW22 facing the second portion 254B of the improper-fraction type capping layer 254. A separation distance between the second sidewall SW22 and each insulation fence 244B may be substantially the same or gradually increase as the distance from the substrate 110 increases.

Detailed structures of the plurality of insulation capping patterns 236, the plurality of insulation fences 244B, and the improper-fraction type capping layer 254 are mostly the same as those of the plurality of insulation capping patterns 136, the plurality of insulation fences 144B, and the improper-fraction type capping layer 154 described above with reference to FIGS. 2A and 2B.

In the IC device 200 of FIGS. 3A and 3B, an insulation structure including each insulation capping pattern 236 and the improper-fraction type capping layer 254 may be formed on each bit line BL, and thus a minimum CD in the horizontal direction required by an insulation structure covering an upper surface of the bit line BL may be easily secured. Accordingly, a sufficient insulation space is secured between the plurality of bit lines BL, the plurality of metal silicide layers 172, the plurality of conductive landing pads LP, and other conductive patterns by the insulation capping patterns 236 and the improper-fraction type capping layer 254, and thus occurrence of an unwanted short circuit may be prevented. Moreover, because the insulation spacers SPC1 covering respective both sidewalls of the plurality of bit lines BL are covered by the improper-fraction type capping layer 254, a sufficient insulation distance may be secured between the plurality of conductive landing pads LP and the bit lines BL adjacent thereto by the insulation spacers SPC1 and the improper-fraction type capping layer 254. Accordingly, occurrence of an unwanted short circuit between each conductive landing pad LP and each bit line BL may be prevented.

Figure 4A:
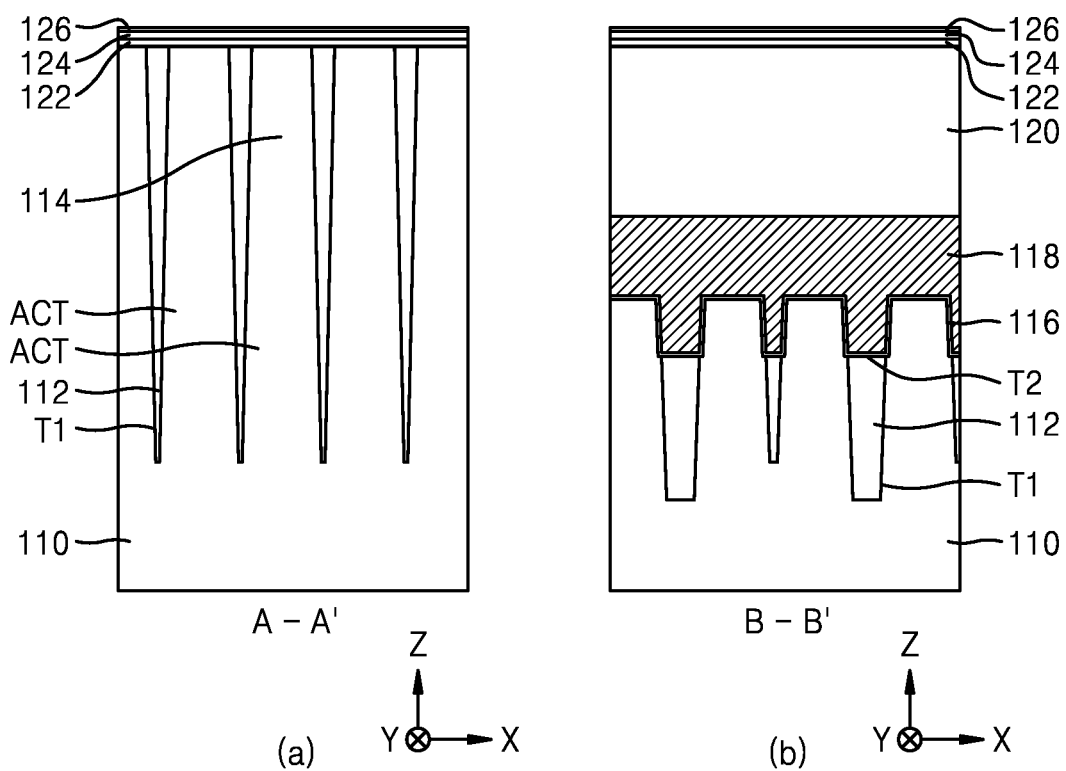
FIGS. 4A through 4N are cross-sectional views for explaining a method of manufacturing an IC device, according to example embodiments of the inventive concept.
Figure 4B:
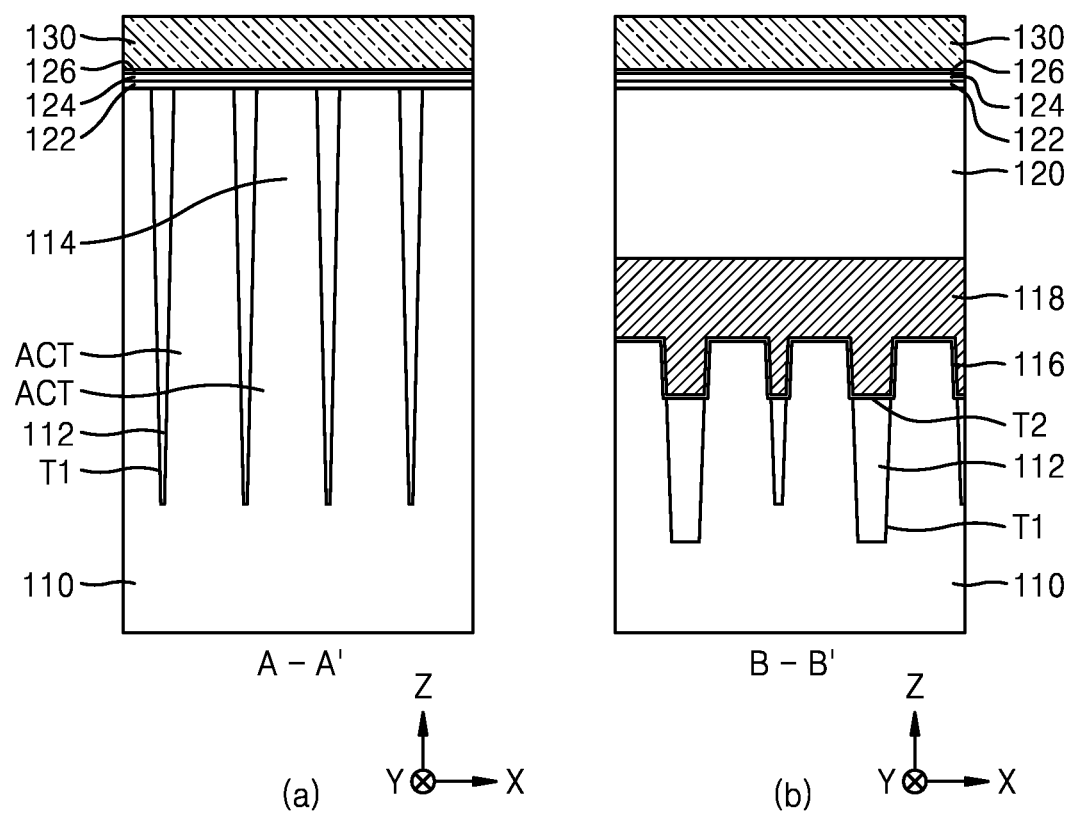
Figure 4C:
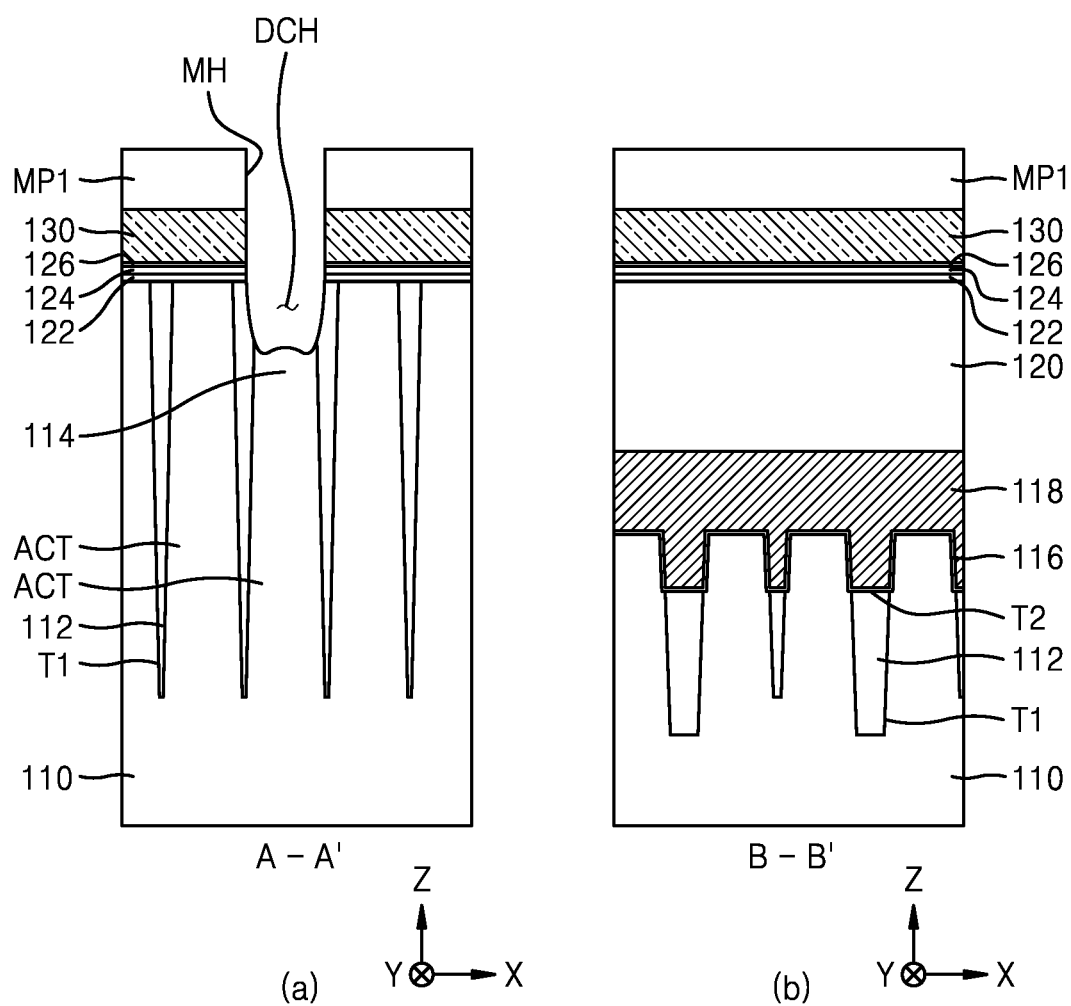
Figure 4D:
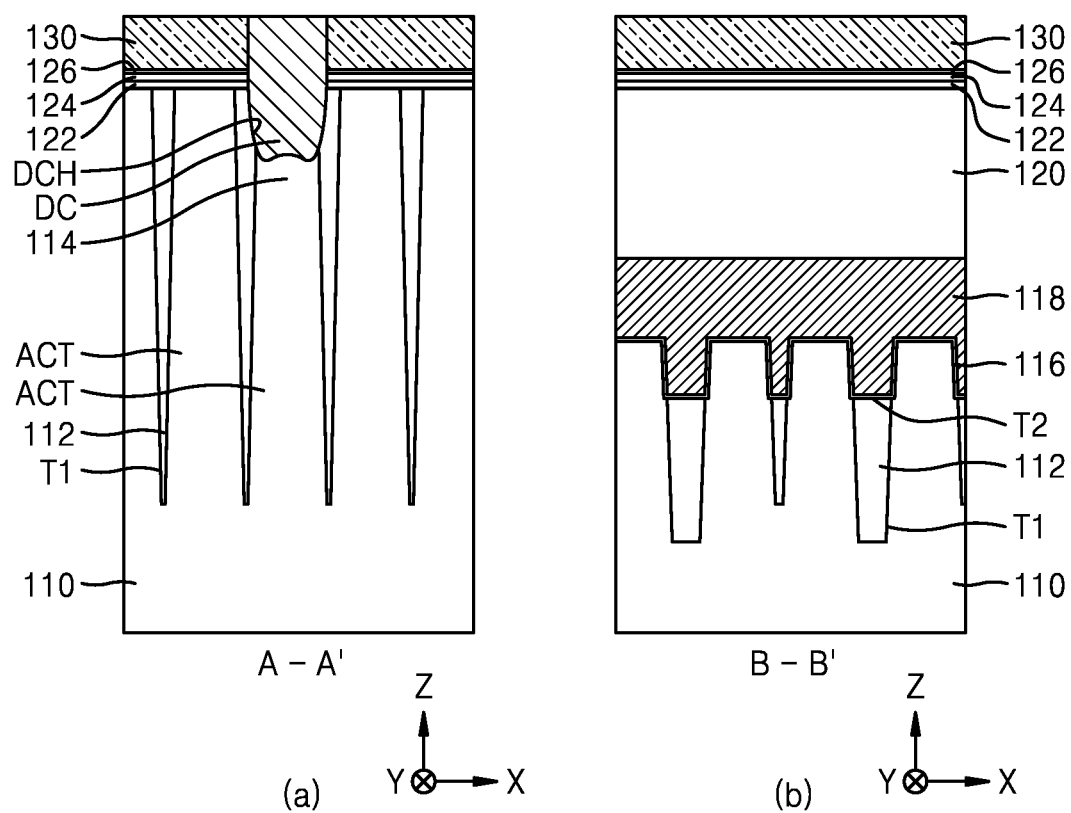
Figure 4E:
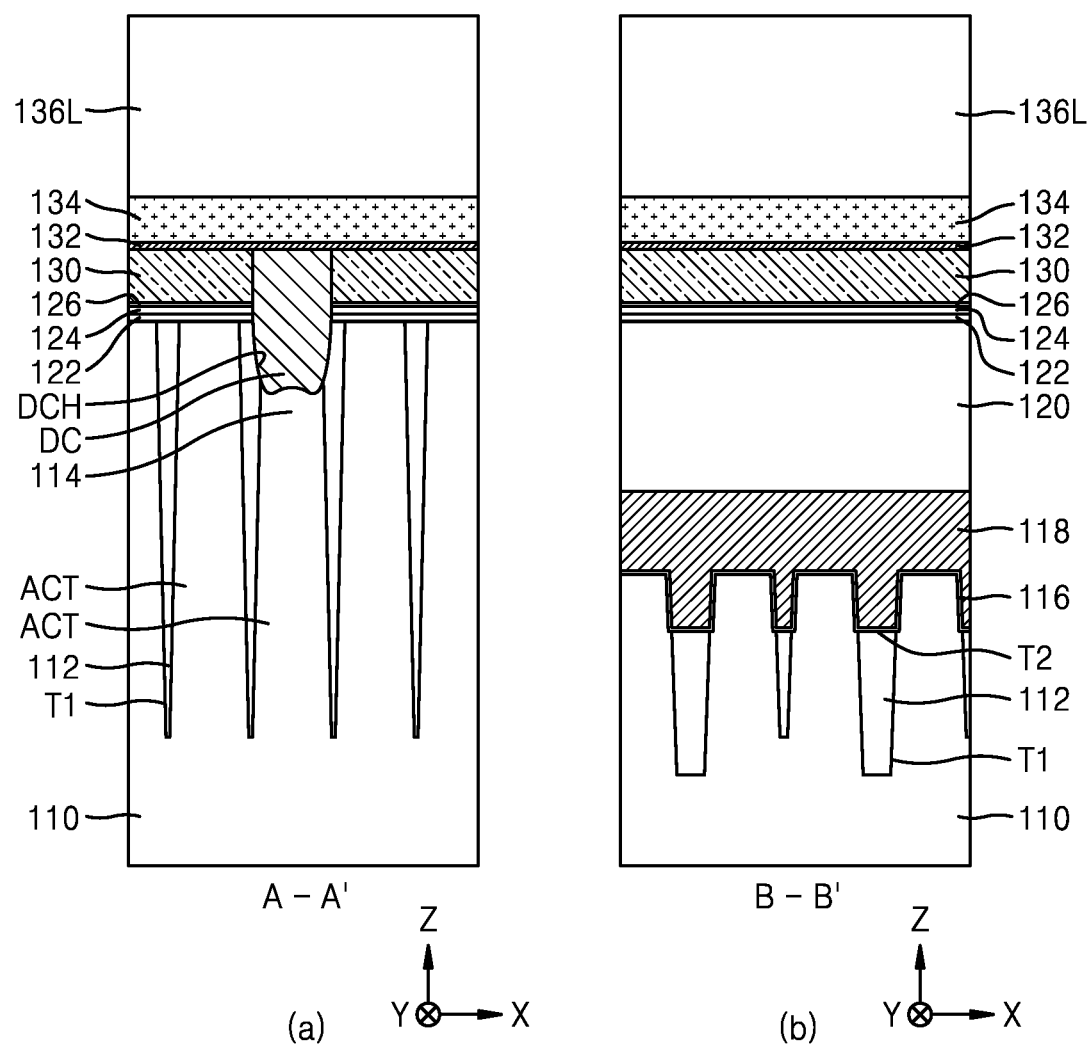
Figure 4F:
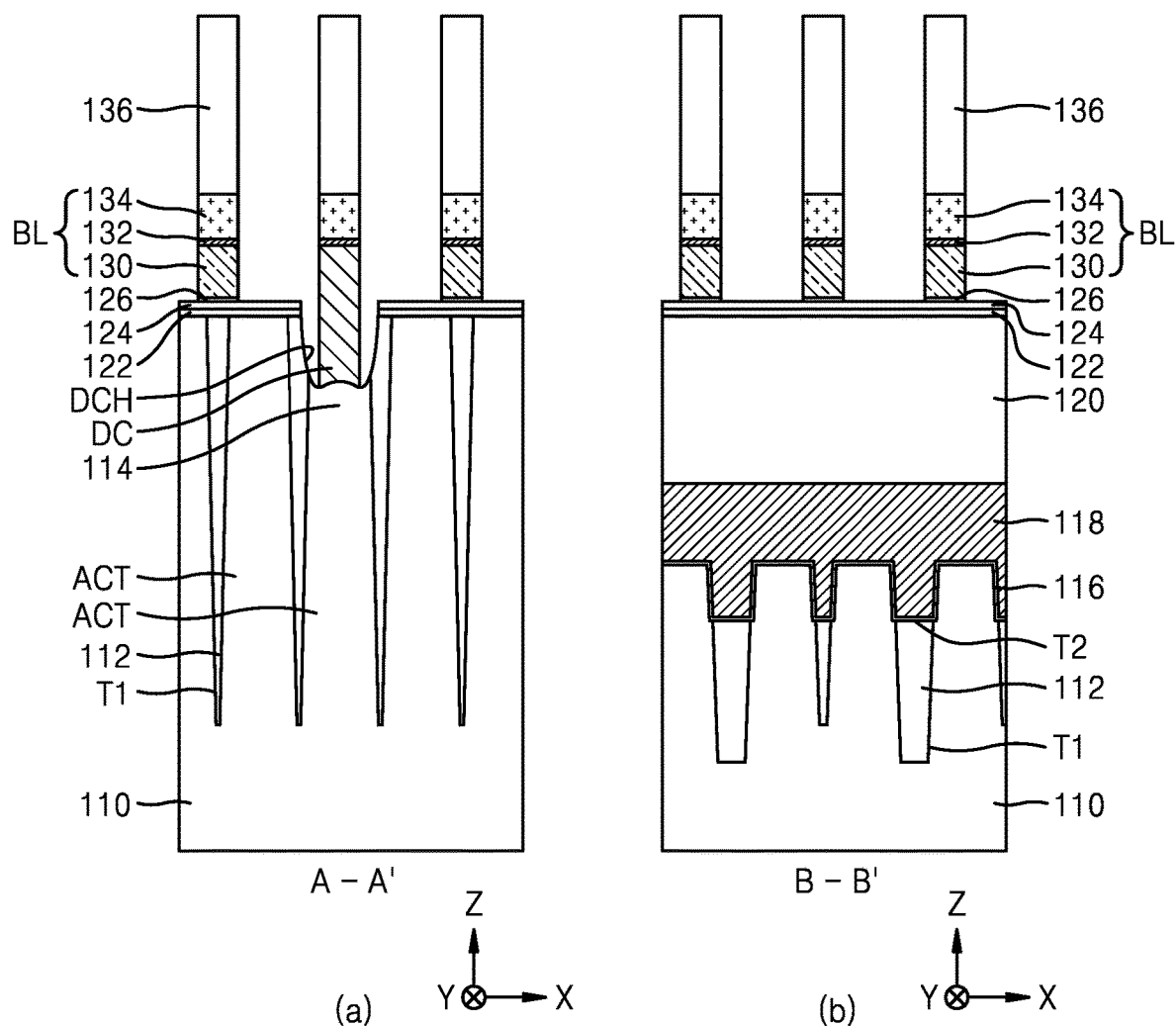
Figure 4G:
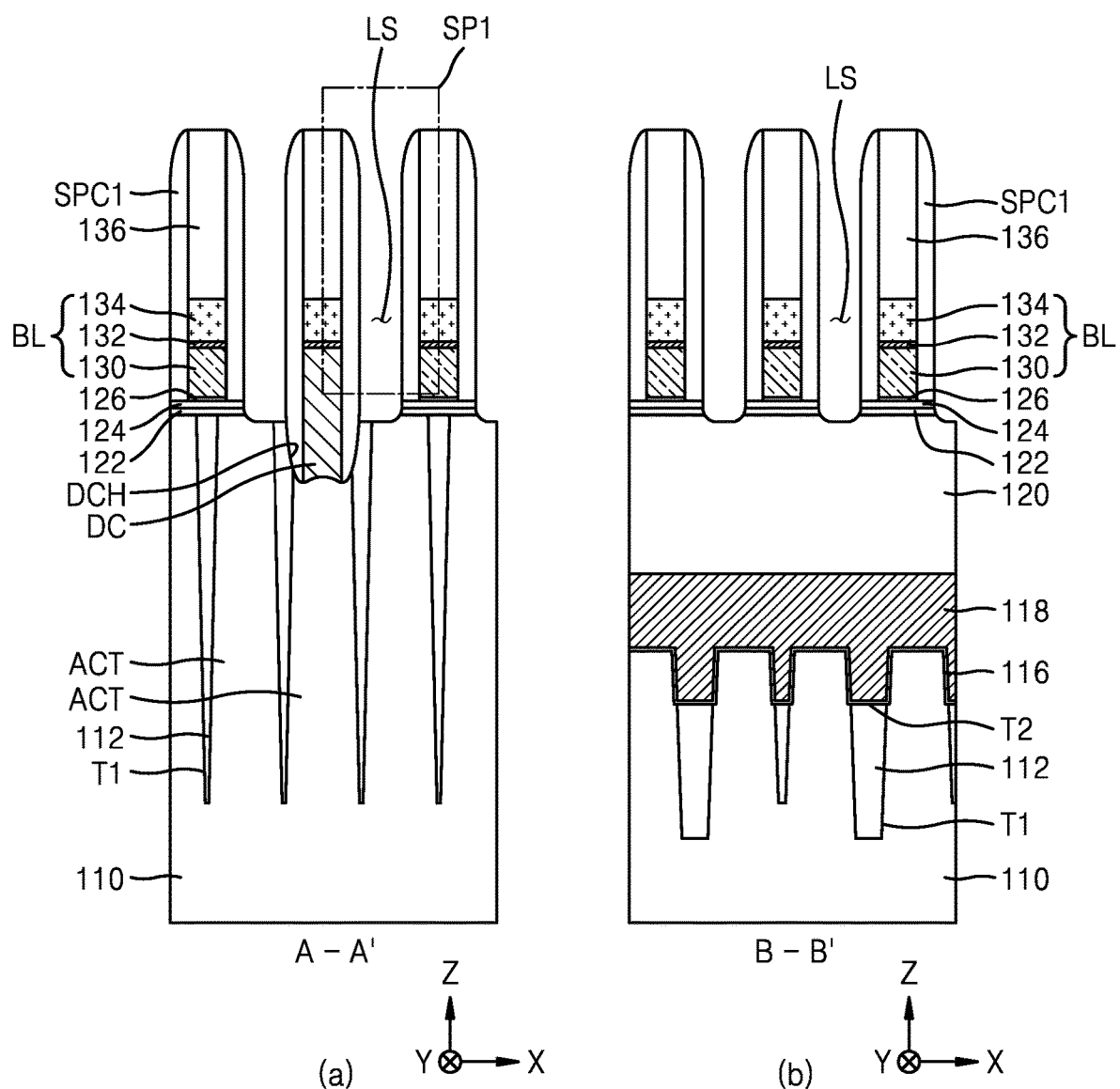
Figure 4H:
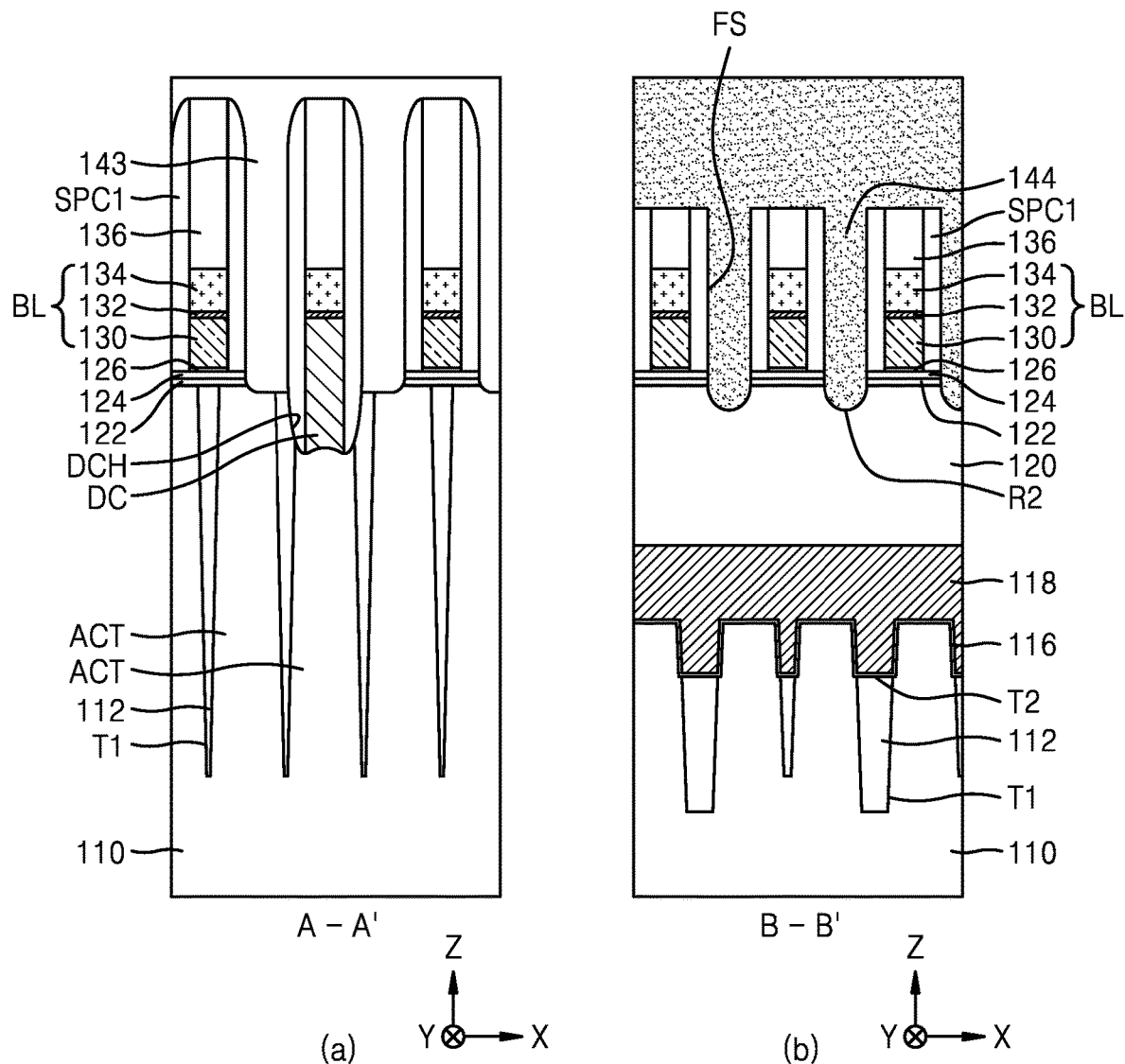
Figure 4I:
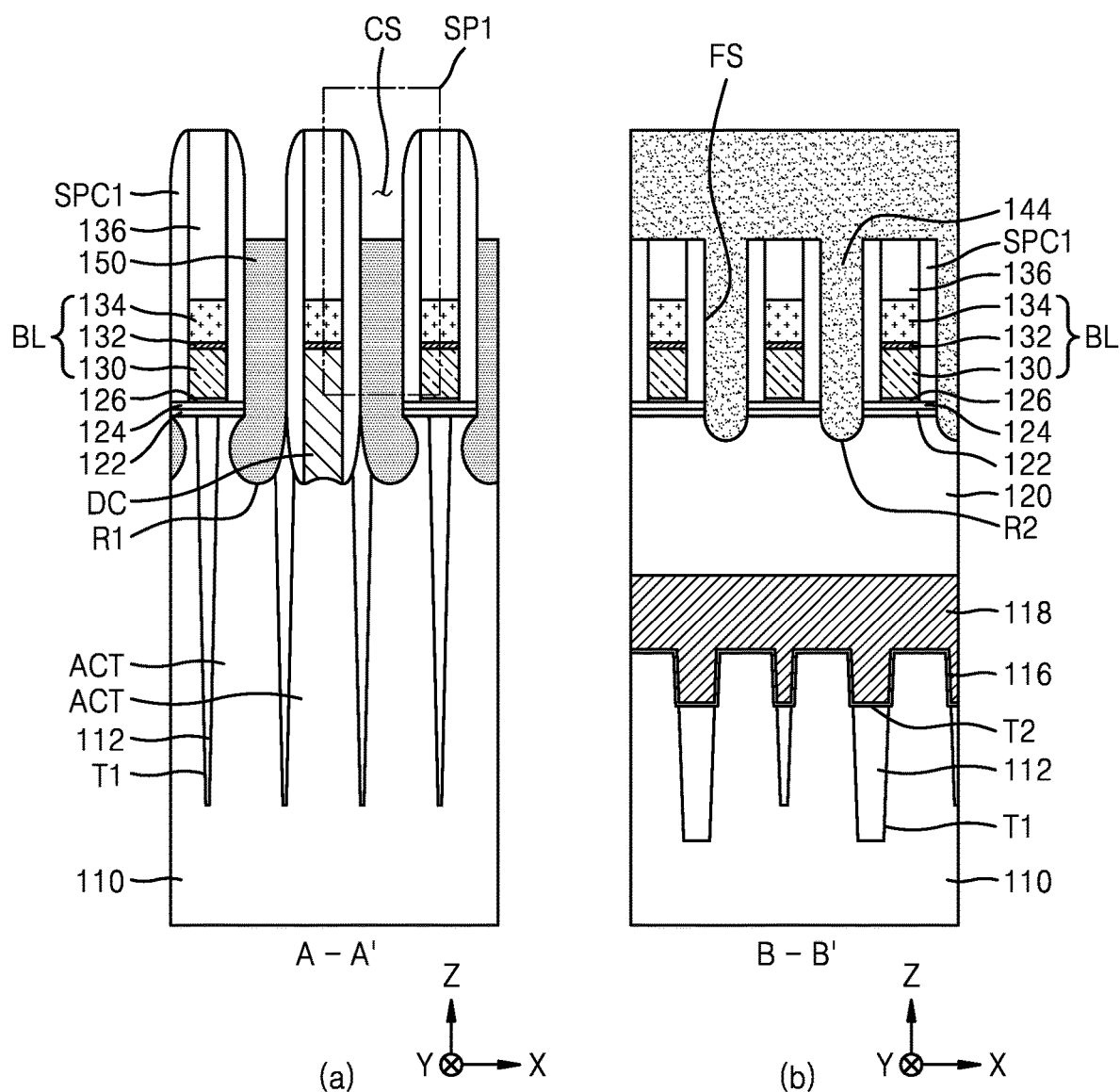
Figure 4J:
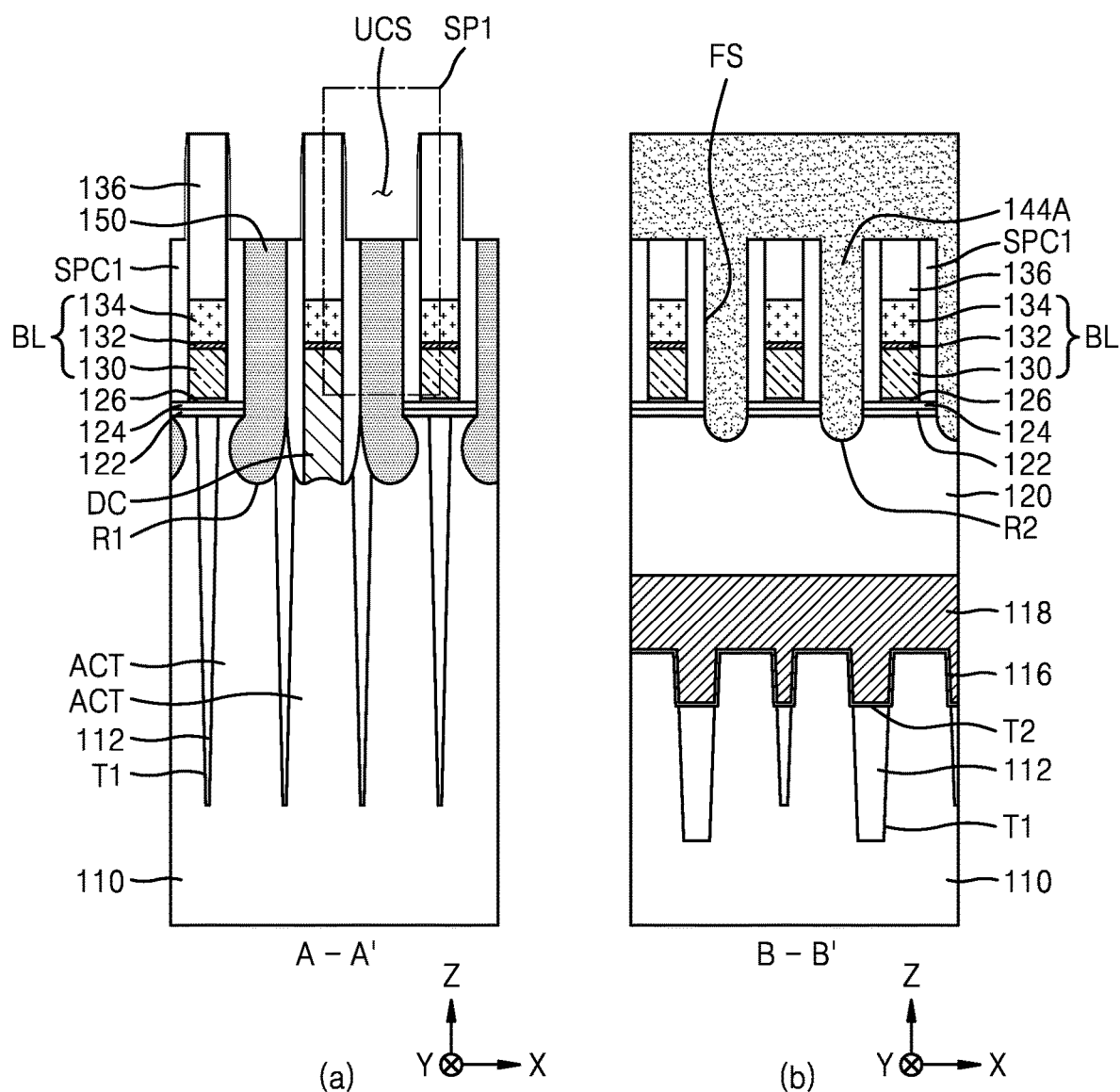
Figure 4K:
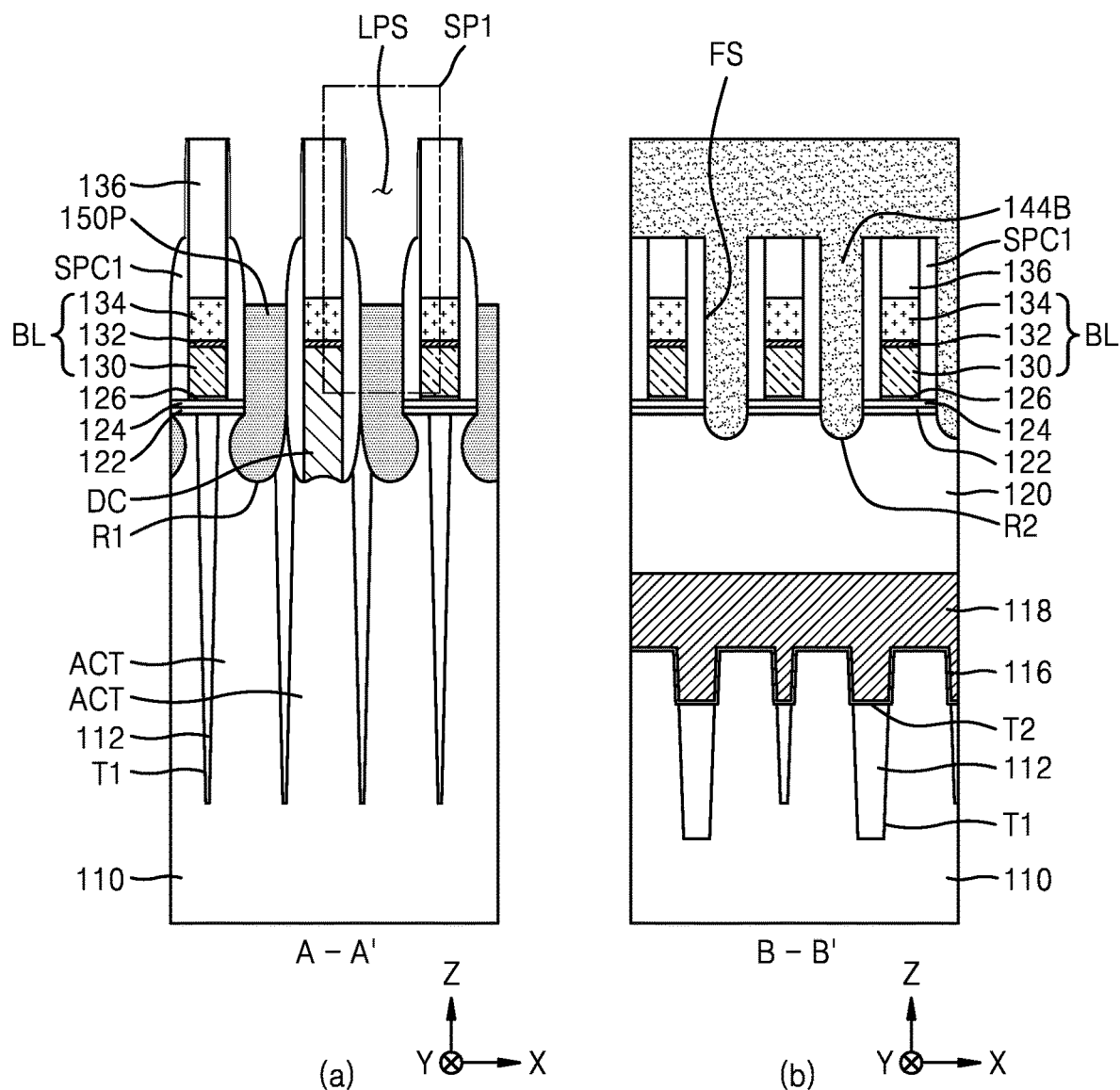
Figure 4L:
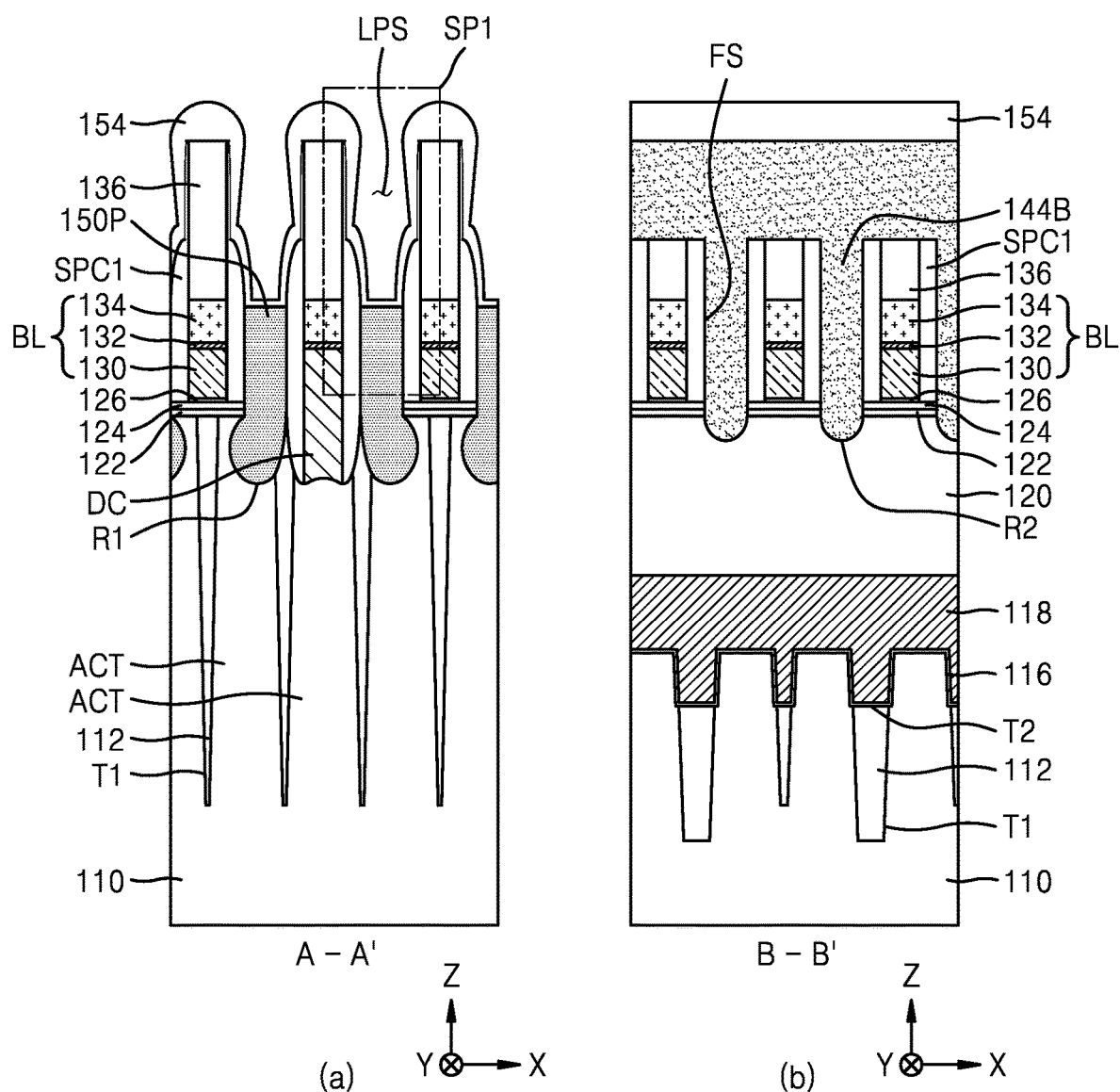
Figure 4M:
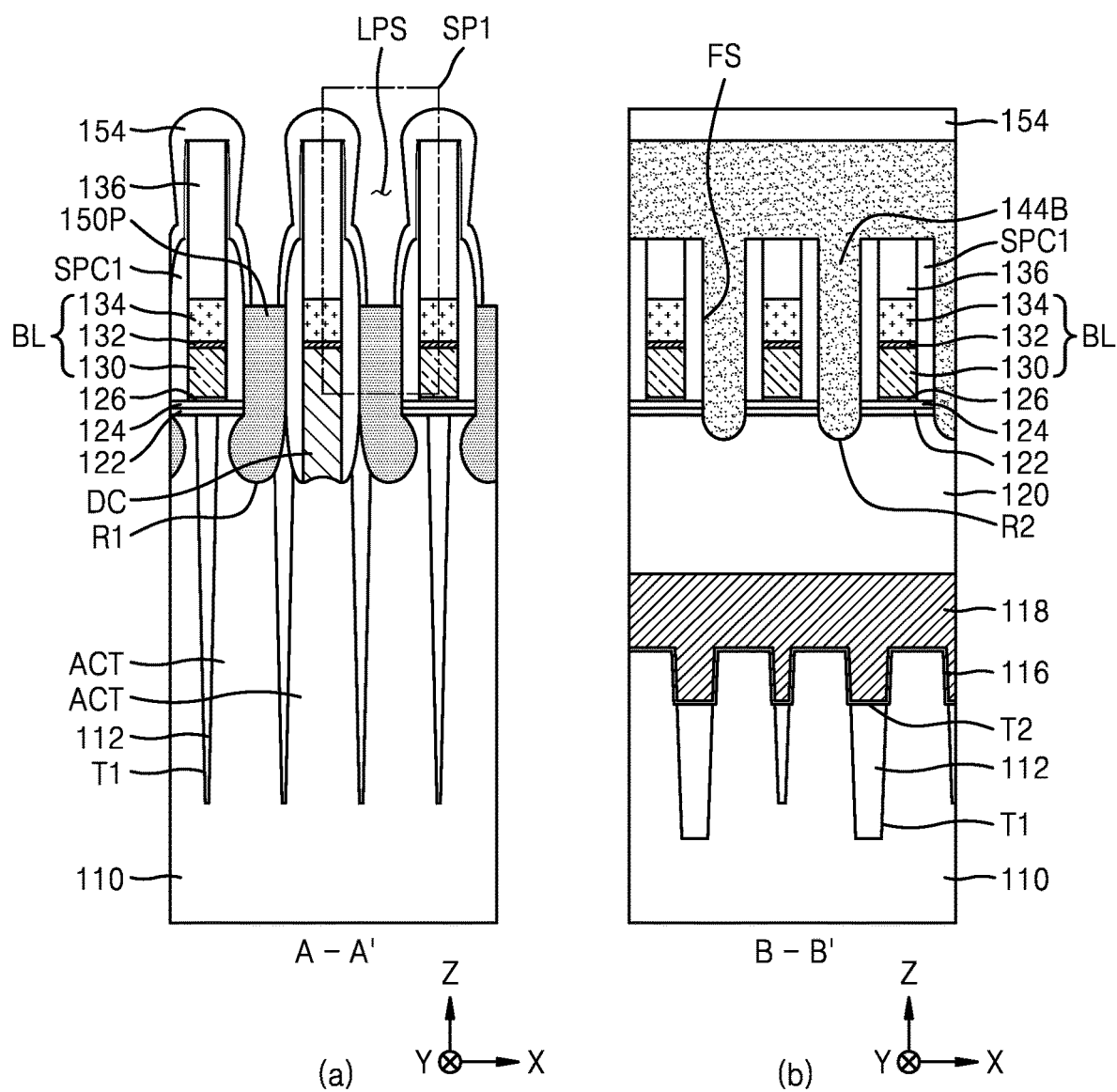
Figure 4N:
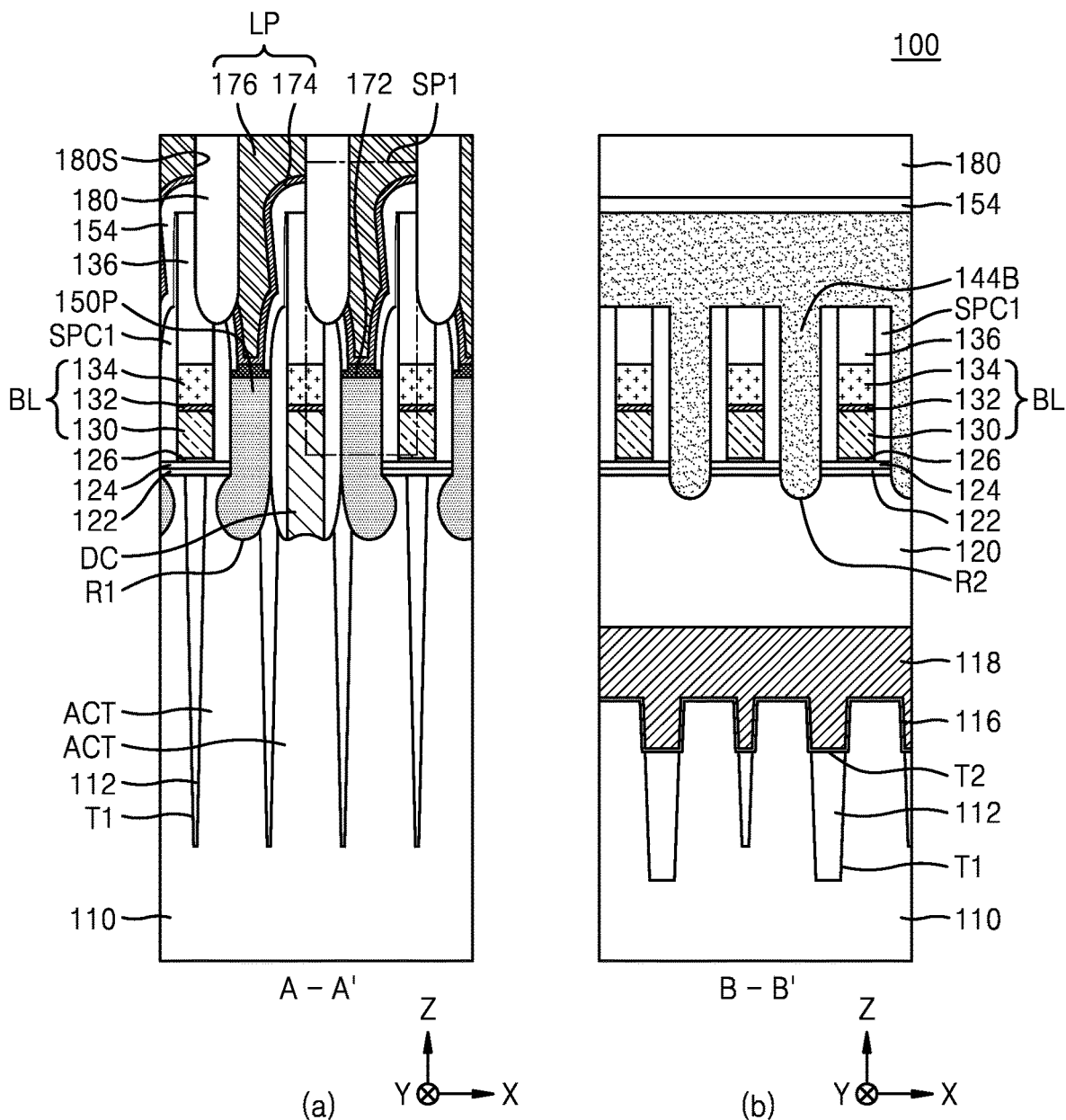

FIGS. 4A through 4N are cross-sectional views for explaining a method of manufacturing an IC device, according to example embodiments of the inventive concept. In FIGS. 4A through 4N, (a) is a cross-sectional view of some components of a portion corresponding to the cross-section taken along line A-A' of FIG. 1, and (b) is a cross-sectional view of some components of a portion corresponding to the cross-section taken along line B-B' of FIG. 1. A method of manufacturing the IC device 100 of FIGS. 2A and 2B will now be described with reference to FIGS. 4A through 4N.

Referring to FIG. 4A, an isolation trench T1 is formed in the substrate 110, and an isolation layer 112 is formed in the isolation trench T1. An active region ACT may be defined in the substrate 110 by the isolation layer 112. The isolation layer 112 may include an oxide layer, a nitride layer, or a combination thereof.

A plurality of word line trenches T2 may be formed in the substrate 110. The plurality of word line trenches T2 may extend parallel to each other in the X direction and may have line shapes that extend across the active region ACT. As shown in the cross-sectional view (b) in FIG. 4A, to form the plurality of word line trenches T2 each having a step at a bottom surface thereof, the isolation layer 112 and the substrate 110 may be respectively etched by separate etching processes, and thus have different etch depths. A resultant structure in which the plurality of word line trenches T2 are formed may be cleaned, and then a gate dielectric layer 116, a word line 118, and a buried insulation layer 120 may be formed in this stated order in each of the plurality of word line trenches T2. According to some embodiments, before or after a plurality of word lines 118 are formed, impurity ions may be injected into the substrate 110 from both sides of each of the plurality of word lines 118, thereby forming a plurality of source/drain regions 114 in upper portions of a plurality of active regions ACT.

The gate dielectric layer 116 may include at least one selected from a silicon oxide layer, a silicon nitride layer, a silicon oxynitride layer, oxide/nitride/oxide (ONO), or a high-k dielectric layer having a higher dielectric constant than a silicon oxide layer. For example, the gate dielectric layer 116 may have a dielectric constant of about 10 to about 25. According to some embodiments, the gate dielectric layer 116 may include, but is not limited to, $HfO_2$, $Al_2O_3$, $HfAlO_3$, $Ta_2O_3$, $TiO_2$, or a combination thereof. Each of the plurality of word lines 118 may include Ti, TiN, Ta, TaN, W, WN, TiSiN, WSiN, or a combination thereof. Each of the plurality of buried insulation layers 120 may include a silicon oxide layer, a silicon nitride layer, a silicon oxynitride layer, or a combination thereof.

An insulation layer structure including a first insulation layer 122, a second insulation layer 124, and a third insulation layer 126 is formed on the plurality of buried insulation layers 120 and the substrate 110.

Referring to FIG. 4B, a lower conductive layer 130 is formed on the third insulation layer 126. The lower conductive layer 130 may include doped polysilicon.

Referring to FIG. 4C, a mask pattern MP1 is formed on the lower conductive layer 130, followed by etching the lower conductive layer 130 exposed via an opening MH of the mask pattern MP1, and then, a portion of the substrate 110 and a portion of the isolation layer 112, which are exposed as a result, are etched, thereby forming a direct contact hole DCH exposing the active region ACT of the substrate 110.

The mask pattern MP1 may include an oxide layer, a nitride layer, or combinations thereof. A photolithography process may be used to form the mask pattern MP1.

Referring to FIG. 4D, the mask pattern MP1 (see FIG. 4C) is removed, and a direct contact DC is formed in the direct contact hole DCH.

In an example of a process of forming the direct contact DC, a conductive layer, which has a sufficient thickness to fill the direct contact hole DCH, may be formed in the direct contact hole DCH and on the lower conductive layer 130, and the conductive layer may be etched back such that the conductive layer remains only in the direct contact hole DCH. The conductive layer for forming the direct contact DC may be doped polysilicon, without being limited thereto.

Referring to FIG. 4E, an intermediate conductive layer 132, an upper conductive layer 134, and an insulation capping layer 136L are formed on the lower conductive layer 130 and the direct contact DC in this stated order.

Each of the intermediate conductive layer 132 and the upper conductive layer 134 may include TiN, TiSiN, W, W silicide, or a combination thereof. According to some embodiments, the intermediate conductive layer 132 may be TiSiN, and the upper conductive layer 134 may be W. The insulation capping layer 136L may be a silicon nitride layer.

Referring to FIG. 4F, each of the insulation capping layer 136L, the upper conductive layer 134, the intermediate conductive layer 132, the lower conductive layer 130, and the direct contact DC is partially etched in a resultant structure of FIG. 4E by using an etch mask (not shown), thereby forming the plurality of bit lines BL and the plurality of insulation capping patterns 136 covering the plurality of bit lines BL. The plurality of bit lines BL may include respective remaining portions of the lower conductive layer 130, the intermediate conductive layer 132, and the upper conductive layer 134. Each of the plurality of bit lines BL and the plurality of insulation capping patterns 136 may be formed in a line pattern extending in the Y direction. After the plurality of bit lines BL are formed, the direct contact hole DCH may be partially exposed again around the direct contact DC.

When the lower conductive layer 130 is etched to form the plurality of bit lines BL, the third insulation layer 126 right below the lower conductive layer 130 may also be etched due to excessive etching, and thus only a portion of the third insulation layer 126 covered by the plurality of bit lines BL may remain and an upper surface of the second insulation layer 124 may be exposed around the plurality of bit lines BL.

Referring to FIG. 4G, a plurality of insulation spacers SPC1 are formed to cover sidewalls of the plurality of bit lines BL, sidewalls of the plurality of insulation capping patterns 136, and sidewalls of a plurality of direct contacts DC. The plurality of insulation spacers SPC1 may be formed to fill empty spaces of a plurality of direct contact holes DCH.

Each of the plurality of insulation spacers SPC1 may extend parallel to the plurality of bit lines BL in the Y direction to cover respective both sidewalls of the plurality of bit lines BL.

FIGS. 5A through 5D are cross-sectional views illustrating sequential processes of a method of forming the plurality of insulation spacers SPC1 shown in FIG. 4G. In FIGS. 5A through 5D, a region corresponding to a dashed-dotted-line region "SP1" in FIG. 4G is enlarged and illustrated.

Figure 5A:
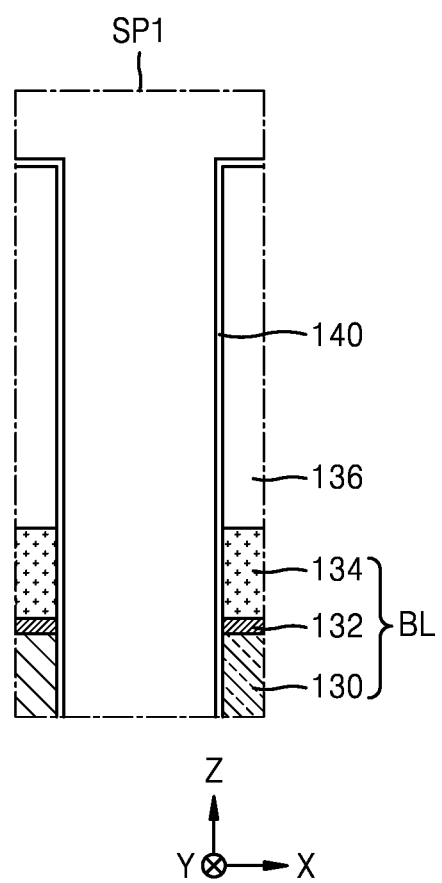
FIGS. 5A through 5D are cross-sectional views illustrating sequential processes of a method of forming a plurality of insulation spacers included in an IC device, according to example embodiments of the inventive concept.

Referring to FIGS. 4G and 5A, an insulation liner 140 is formed on the entire surface of a resultant structure of FIG. 4F to conformally cover exposed surfaces of the plurality of bit lines BL, exposed surfaces of the plurality of insulation capping patterns 136, exposed surfaces of the plurality of direct contacts DC, and an exposed surface of the second insulation layer 124 in the resultant structure of FIG. 4F. The insulation liner 140 may include a silicon nitride layer.

Figure 5B:
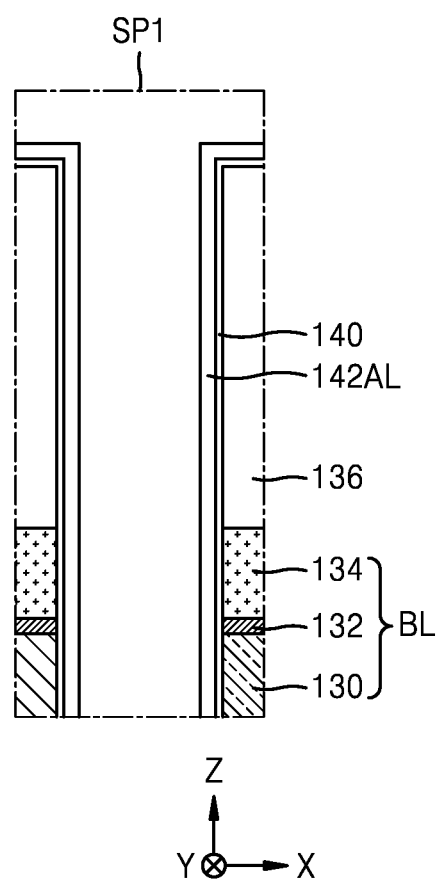

Referring to FIG. 5B, a lower insulation buried pattern (not shown) is formed on the insulation liner 140 to fill remaining spaces of direct contact holes DCH and at the same time cover respective sidewalls of the plurality of direct contacts DC, and then a first insulation spacer layer 142AL covering the lower insulation buried pattern and a sidewall of the insulation liner 140 is formed. The first insulation spacer layer 142AL may cover the plurality of bit lines BL, the plurality of insulation capping patterns 136, the plurality of direct contacts DC, and the second insulation layer 124 with the insulating liner 140 therebetween. The first insulation spacer layer 142AL may be a silicon oxide layer.

Figure 5C:
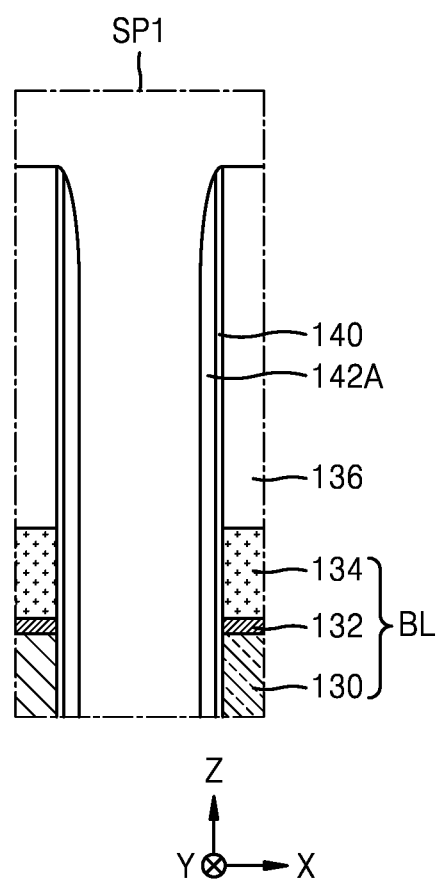

Referring to FIG. 5C, a plurality of first insulation spacers 142A covering respective both sidewalls of the plurality of bit lines BL are formed by etching back the first insulation spacer layer 142AL in a resultant structure of FIG. 5B. While the first insulation spacer layer 142AL is being etched back, the insulation liner 140 may also be partially removed on the second insulation layer 124 (see FIG. 4G) due to excessive etching. The insulation liner 140 may remain between each bit line BL and each first insulation spacer 142A, and between each insulation capping pattern 136 and the first insulation spacers 142A. Although not shown in FIG. 5C, the insulation liner 140 may also remain between the second insulation layer 124 (see FIG. 4G) and the plurality of first insulation spacers 142A.

Figure 5D:
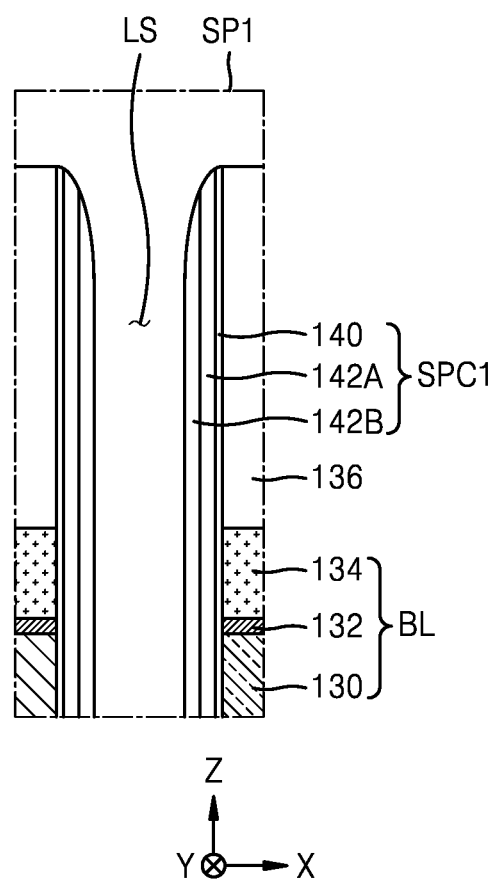

Referring to FIG. 5D, a plurality of second insulation spacers 142B are formed on the plurality of first insulation spacers 142A by using a similar method to the method of forming the plurality of first insulation spacers 142A, thereby obtaining the plurality of insulation spacers SPC1. Each of the plurality of second insulation spacers 142B may be a silicon nitride layer.

Referring back to FIG. 4G, after the plurality of insulation spacers SPC1 are formed, each line space LS extending in the Y direction may be defined on the second insulation layer 124 between a plurality of line structures including the plurality of bit lines BL and the plurality of insulation capping patterns 136.

While the plurality of insulation spacers SPC1 are being formed, portions of the second and first insulation layers 124 and 122, a portion of the substrate 110, and a portion of each of the plurality of buried insulation layers 120 may be consumed in spaces between the plurality of bit lines BL. Consequently, after the plurality of insulation spacers SPC1 are formed, a portion of the substrate 110 and a portion of each of the plurality of buried insulation layers 120 may be consumed in line spaces LS between the plurality of bit lines BL. Referring to FIG. 4H, a sacrificial layer 143 is formed between the plurality of bit lines BL to fill the plurality of line spaces LS. The sacrificial layer 143 may include a material having a different etch selectivity from the plurality of insulation capping patterns 136. For example, the plurality of insulation capping patterns 136 may be a silicon nitride layer, and the sacrificial layer 143 may be a silicon oxide layer. However, the inventive concept is not limited thereto.

Thereafter, some regions of the sacrificial layer 143 that cover the plurality of buried insulation layers 120 are etched using the mask pattern as an etch mask, thereby forming a plurality of fence spaces FS (see (b) of FIG. 4H) that expose the plurality of buried insulation layers 120 between the plurality of bit lines BL. While the some regions of the sacrificial layer 143 are being etched to form the plurality of fence spaces FS, as illustrated in (b) of FIG. 4H, portions of the plurality of insulation capping patterns 136 and the plurality of insulation spacers SPC1 that are adjacent to the plurality of fence spaces FS in the Y direction may be partially consumed, and thus some regions of the plurality of insulation capping patterns 136 and some regions of the plurality of insulation spacers SPC1 may have reduced heights. Moreover, while the some regions of the sacrificial layer 143 are being etched to form the plurality of fence spaces FS, portions of the plurality of buried insulation layers 120 exposed via the plurality of fence spaces FS may be removed, and thus a plurality of recess spaces R2 may be formed in upper surfaces of the plurality of buried insulation layers 120.

However, as illustrated in (a) of FIG. 4H, portions of the plurality of insulation capping patterns 136 and the plurality of insulation spacers SPC1 that are adjacent to regions between the plurality of fence spaces FS in the X direction may be protected by the sacrificial layer 143 during an etch process for forming the plurality of fence spaces FS, and thus may maintain the heights thereof before the plurality of fence spaces FS are formed, without substantial consumption. Accordingly, the plurality of insulation capping patterns 136 and the plurality of insulation spacers SPC1 have heights that vary in the direction (Y direction) in which each bit line BL extends lengthwise, and thus upper surfaces of the plurality of insulation capping patterns 136 and upper surfaces of the plurality of insulation spacers SPC1 may each extend in an uneven shape in the Y direction.

Thereafter, an insulation fence 144 is formed to fill the plurality of fence spaces FS. The insulation fence 144 may be formed to cover the plurality of fence spaces FS and upper surfaces of the plurality of insulation capping patterns 136 adjacent to the plurality of fence spaces FS in the X direction. According to some embodiments, the insulation fence 144 may be a silicon nitride layer.

After the insulation fence 144 is formed, spaces filled with the sacrificial layer 143 between the plurality of bit lines BL may serve as a plurality of contact spaces CS (see FIG. 4I).

Referring to FIG. 4I, the sacrificial layer 143 is removed from a resultant structure of FIG. 4H to expose the plurality of active regions ACT via the plurality of contact spaces CS defined by the insulation fence 144 between the plurality of bit lines BL, and then exposed portions of the plurality of active regions ACT are removed to form a plurality of first recess spaces R1. According to some embodiments, the plurality of first recess spaces R1 may be formed via anisotropic etching, isotropic etching, or a combination thereof Thereafter, a plurality of preliminary conductive plugs 150 are formed to fill the plurality of first recess spaces R1 and also fill portions of the plurality of contact spaces CS between the plurality of bit lines BL.

A vertical distance (distance in the Z direction) from the upper surface of the substrate 110 to an upper surface of each of the plurality of preliminary conductive plugs 150 may be greater than that from the upper surface of the substrate 110 to an upper surface of each of the plurality of bit lines BL. To form the plurality of preliminary conductive plugs 150, after the sacrificial layer 143 is removed from the resultant structure of FIG. 4H and the plurality of recess spaces R1 are formed, a conductive layer filling the plurality of recess spaces R1 and the plurality of contact spaces CS and covering the upper surfaces of the plurality of insulation capping patterns 136 and the upper surfaces of the plurality of insulation fences 144 is formed, and then an upper portion of the conductive layer is partially removed via etchback, and thus the upper surfaces of the plurality of insulation capping patterns 136 and the upper surfaces of the plurality of insulation fences 144 may be exposed and respective upper spaces of the plurality of contact spaces CS on the entrance side may be emptied again. Remaining portions of the conductive layer may constitute the plurality of preliminary conductive plugs 150. The plurality of preliminary conductive plugs 150 may include doped polysilicon.

Figure 6:
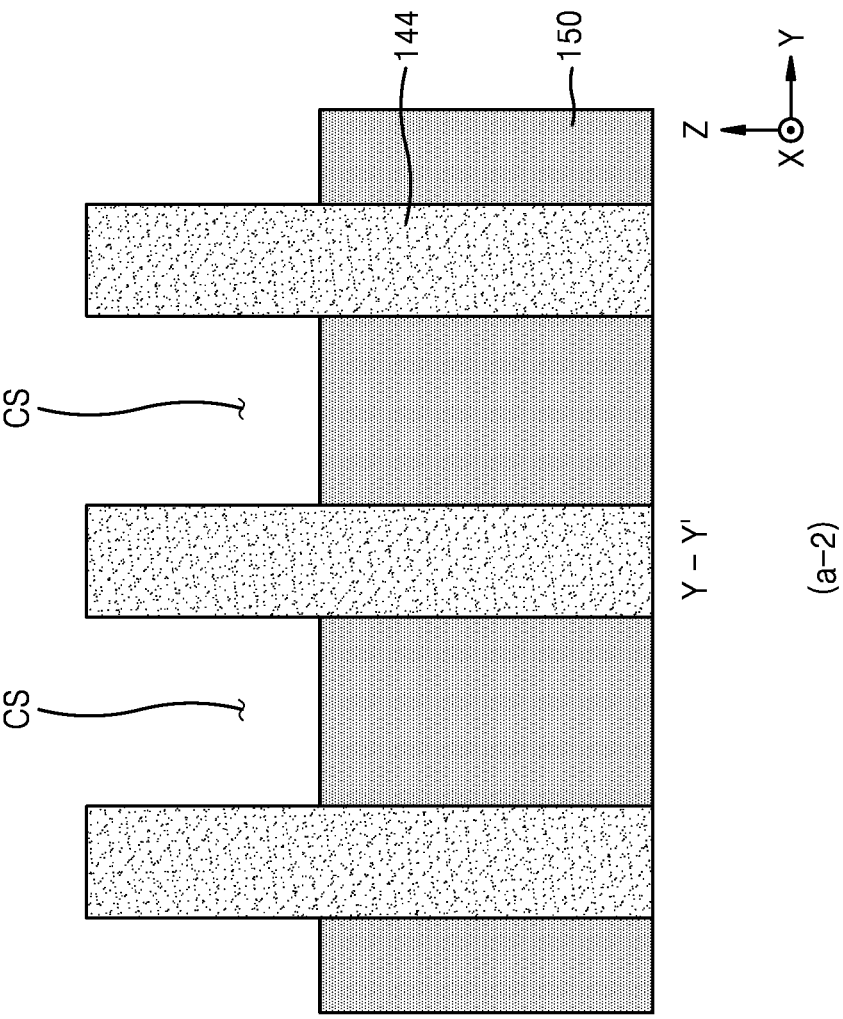
FIGS. 6 through 11 are cross-sectional views of an enlargement of some regions of resultant structures of FIGS. 4I through 4N.
Figure 6:
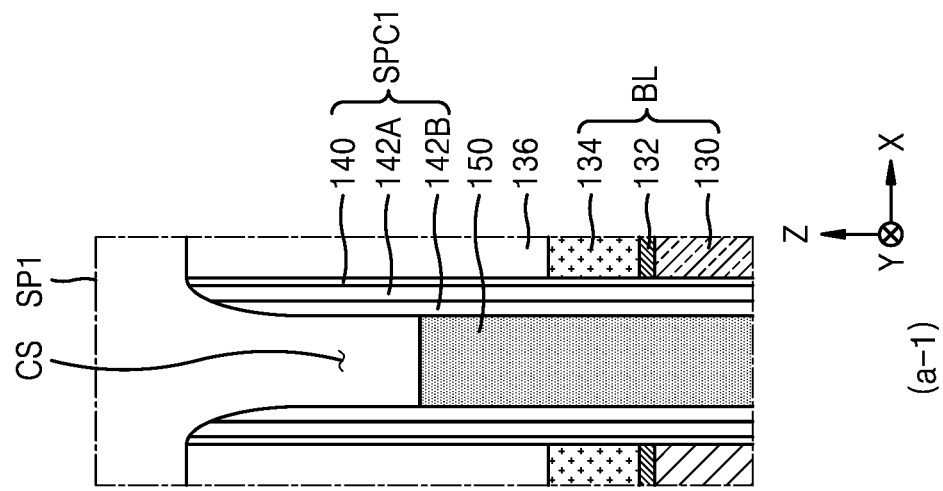

FIG. 6 is a cross-sectional view of an enlargement of some regions of a resultant structure of FIG. 4I. In FIG. 6, (a-1) is a magnified cross-sectional view of a dashed-dotted line region SP1 in (a) of FIGS. 4I, and (a-2) is a magnified cross-sectional view of some components of a portion in the Y direction of the dashed-dotted line region SP1 in FIG. 4I, for example, a portion corresponding to the cross-section taken along line Y-Y' of FIG. 1.

Referring to FIGS. 4I and 6, after the plurality of preliminary conductive plugs 150 are formed, upper portions of the plurality of insulation fences 144 may partially protrude to be on a higher level than the upper surfaces of the plurality of preliminary conductive plugs 150.

Referring to FIG. 4J, the plurality of insulation spacers SPC1 exposed via the respective upper spaces of the plurality of contact spaces CS (see FIG. 4I) on the entrance side are partially removed to expand the widths of the plurality of contact spaces CS toward both sides in the X direction between the plurality of insulation capping patterns 136 and thus form a plurality of upper contact spaces UCS each having an increased width. A width in the X direction of each of the plurality of upper contact spaces UCS may be greater than that of each preliminary conductive plug 150.

According to some embodiments, the plurality of upper contact spaces UCS may be formed by partially wet-etching the plurality of insulation spacers SPC1. For example, to form the plurality of upper contact spaces UCS, the second insulation spacers 142B exposed via the plurality of contact spaces CS may be wet etched and thus the first insulation spacers 142A may be exposed, and then exposed portions of the first insulation spacers 142A may be wet etched and thus the insulation liners 140 may be exposed.

Figure 7:
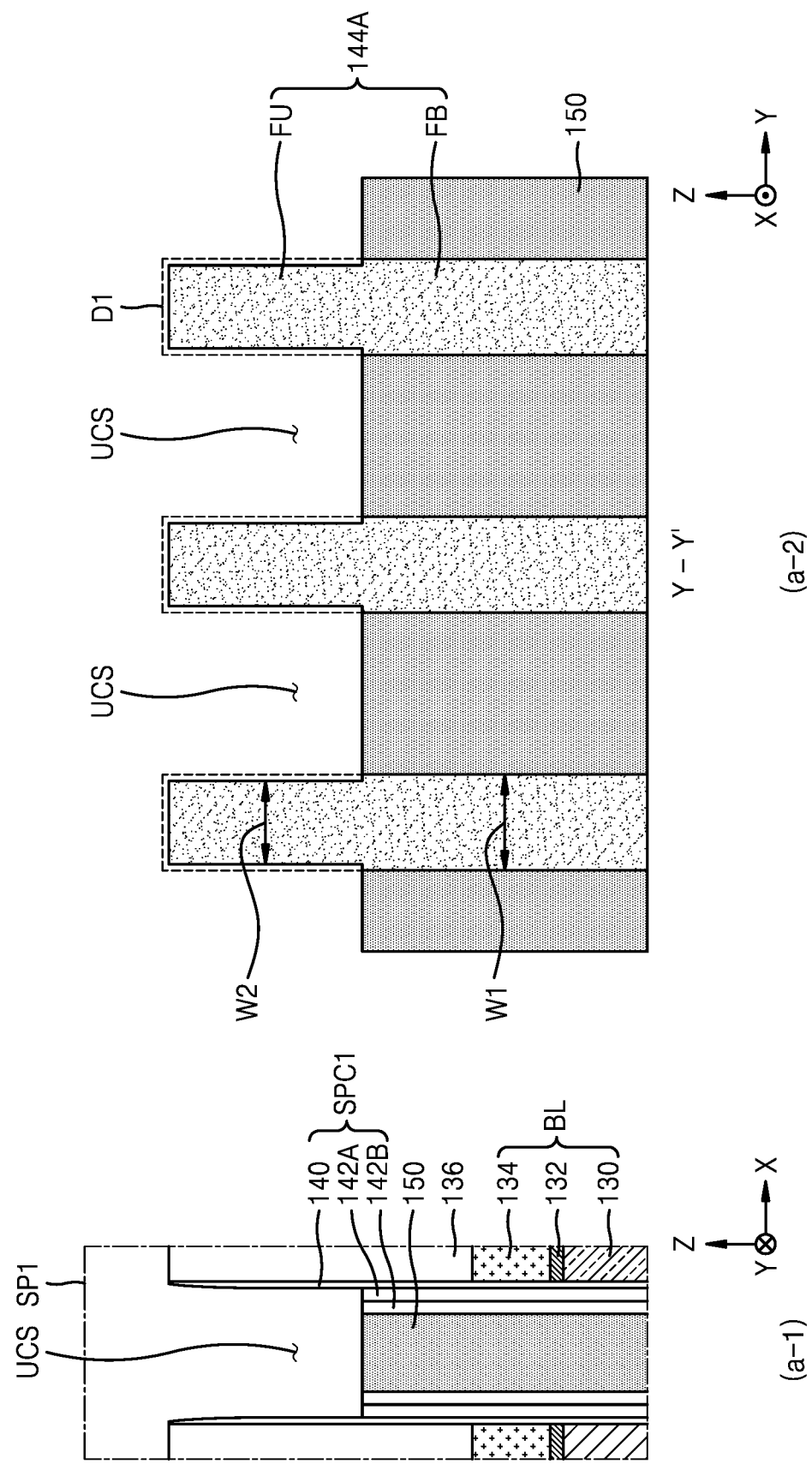

FIG. 7 is a cross-sectional view of an enlargement of some regions of a resultant structure of FIG. 4J. In FIG. 7, (a-1) is a magnified cross-sectional view of a dashed-dotted line region SP1 in (a) of FIG. 4J, and (a-2) is a magnified cross-sectional view of some components of a portion in the Y direction of the dashed-dotted line region SP1 in FIG. 4J, for example, a portion corresponding to the cross-section taken along line Y-Y' of FIG. 1.

Referring to FIGS. 4J and 7, after the plurality of upper contact spaces UCS are formed, the insulation liners 140 may be exposed on both sides in X direction of the plurality of upper contact spaces UCS, and the insulation fences 144 may be exposed on both sides in Y direction of the plurality of upper contact spaces UCS.

While the second insulation spacers 142B and the first insulation spacers 142A are being etched in this stated order to form the plurality of upper contact spaces UCS, surfaces of the plurality of insulation fences 144 exposed under the etching atmosphere may be partially consumed due to an etching atmosphere of the insulation spacers SPC1, and thus a plurality of insulation fences 144A having a smaller size than a size of the insulation fences 144 of FIG. 6 as indicated by a dashed line D1 may be obtained. After the plurality of upper contact spaces UCS are formed, each of the plurality of insulation fences 144A may include a fence base FB having both side walls in the Y direction covered by the plurality of preliminary conductive plugs 150, and a fence upper portion FU protruding over an upper surface of each of the plurality of preliminary conductive plugs 150 and having a width W2 less than a width W1 of the fence base FB in the Y direction. In each of the plurality of insulation fences 144A, the fence base FB and the fence upper portion FU may have the same widths in the X direction as each other.

Referring to FIG. 4K, the plurality of preliminary conductive plugs 150 exposed via the plurality of upper contact spaces UCS are etched by a certain thickness from their respective upper surfaces to form a plurality of conductive plugs 150P having lower heights than the plurality of preliminary conductive plugs 150. After the plurality of conductive plugs 150P are formed, a landing pad space LPS may be formed on an upper surface of each of the plurality of conductive plugs 150P between the plurality of insulation capping patterns 136.

According to some embodiments, a vertical distance (distance in the Z direction) from the upper surface of the substrate 110 to the upper surface of each of the plurality of conductive plugs 150P may be less than that from the upper surface of the substrate 110 to the upper surface of each of the plurality of bit lines BL.

Figure 8:
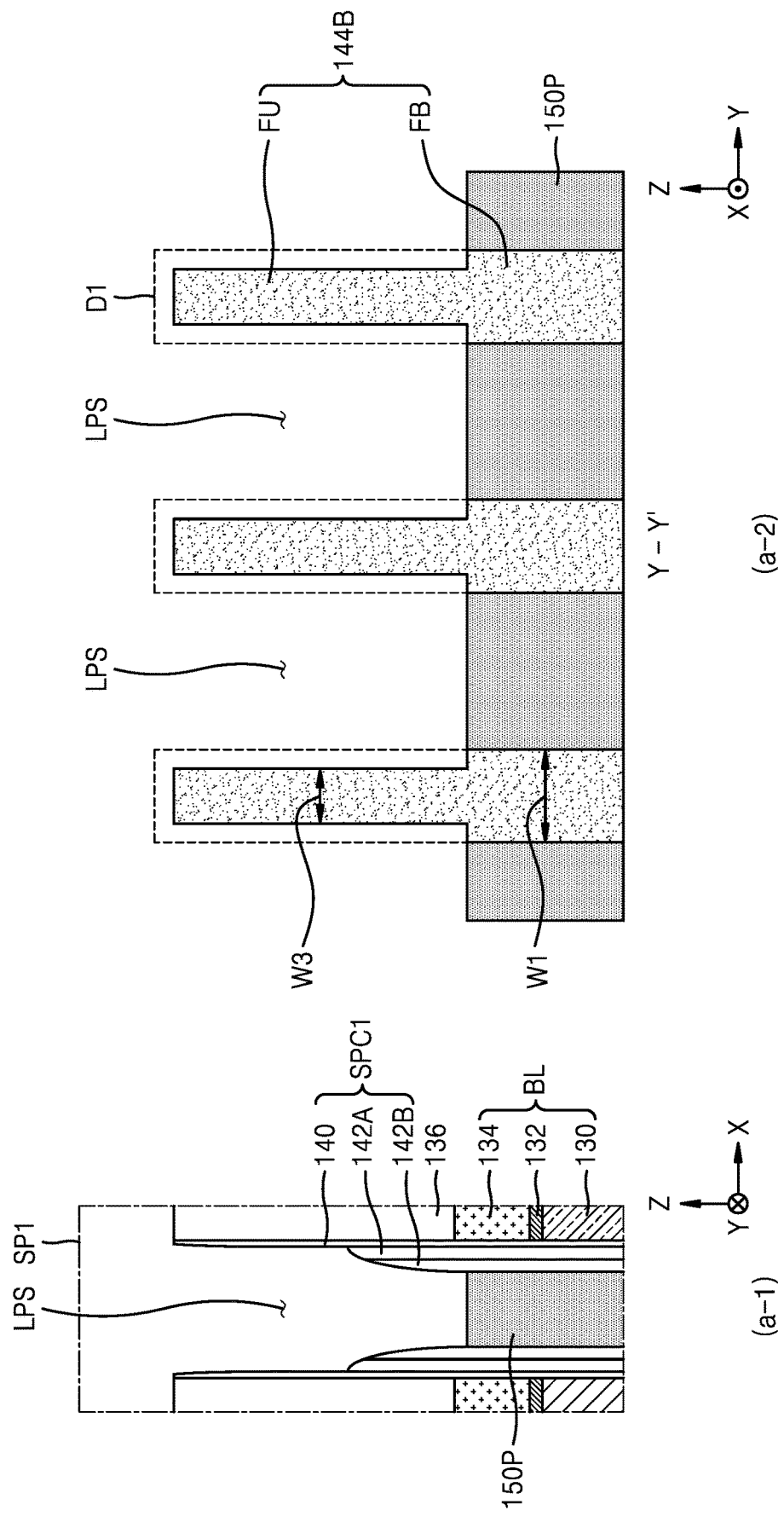

FIG. 8 is a cross-sectional view of an enlargement of some regions of a resultant structure of FIG. 4K. In FIG. 8, (a-1) is a magnified cross-sectional view of a dashed-dotted line region SP1 in (a) of FIG. 4K, and (a-2) is a magnified cross-sectional view of some components of a portion in the Y direction of the dashed-dotted line region SP1 in FIG. 4K, for example, a portion corresponding to the cross-section taken along line Y-Y' of FIG. 1.

Referring to FIGS. 4K and 8, while the plurality of preliminary conductive plugs 150 are being etched to form the plurality of landing pad spaces LPS, surfaces of the plurality of insulation fences 144 exposed under the etching atmosphere within the plurality of upper contact spaces UCS may be consumed, and thus a plurality of insulation fences 144B having a smaller size than the size of the plurality of insulation fences 144 illustrated in (a-2) of FIG. 7 may be obtained. After the plurality of landing pad spaces LPS are formed, each of the plurality of insulation fences 144B may include a fence base FB having both side walls in the Y direction covered by the plurality of conductive plugs 150P, and a fence upper portion FU protruding higher than an upper surface of each of the plurality of conductive plugs 150P and having a width W3 less than a width W1 of the fence base FB in the Y direction. In each of the plurality of insulation fences 144B, the fence base FB and the fence upper portion FU may have the same widths in the X direction as each other. According to some embodiments, while the plurality of preliminary conductive plugs 150 are being etched to form the plurality of landing pad spaces LPS, portions of the plurality of insulation spacers SPC1 exposed under the etching atmosphere may be partially consumed.

Because each of the plurality of insulation fences 144B includes the fence upper portion FU having the width W3 less than the width W1 of the fence base FB, the width in the X direction of each of the plurality of landing pad spaces LPS may be relatively increased. Therefore, a process of forming the plurality of metal silicide layers 172, which will be described later with reference to FIGS. 4N and 11, may be smoothly performed, contributing to lowering contact resistance.

Referring to FIG. 4L, the improper-fraction type capping layer 154 covering the plurality of insulation capping patterns 136 and the plurality of insulation fences 144B is formed on a resultant structure of FIG. 4K in which the plurality of landing pad spaces LPS are formed.

Figure 9:
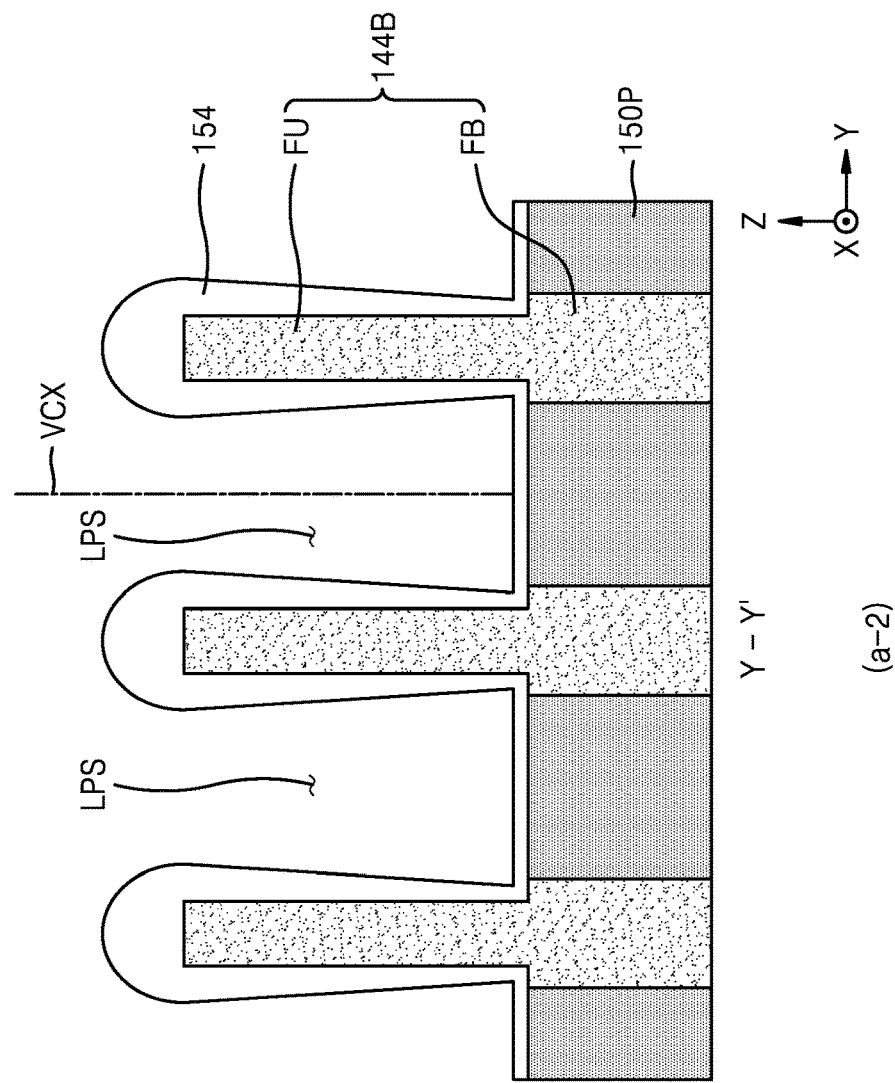
Figure 9:
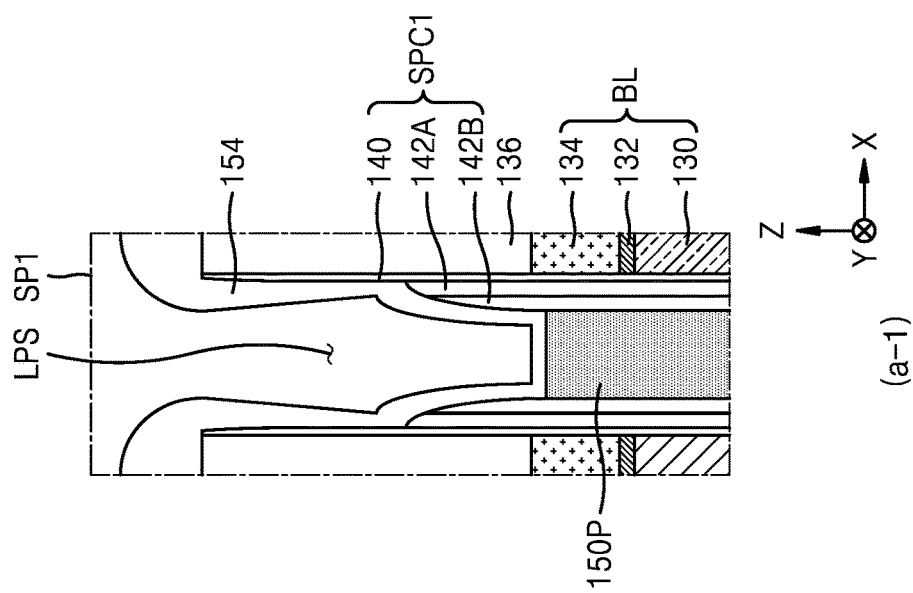

FIG. 9 is a cross-sectional view of an enlargement of some regions of a resultant structure of FIG. 4L. In FIG. 9, (a-1) is a magnified cross-sectional view of a dashed-dotted line region SP1 in (a) of FIG. 4L, and (a-2) is a magnified cross-sectional view of some components of a portion in the Y direction of the dashed-dotted line region SP1 in FIG. 4L, for example, a portion corresponding to the cross-section taken along line Y-Y' of FIG. 1.

Referring to FIGS. 4L and 9, the improper-fraction type capping layer 154 may gradually increase in a width in the horizontal direction as the distance from the substrate 110 increases, on sidewalls of the plurality of insulation capping patterns 136 and sidewalls of the plurality of insulation fences 144B. For example, on the sidewall of each of the plurality of insulation capping patterns 136, the improper-fraction type capping layer 154 may gradually increase in a width in the X direction as the distance from the substrate 110 increases in the Z direction. On the sidewall of each of the plurality of insulation fences 144B, the improper-fraction type capping layer 154 may gradually increase in a width in the Y direction as the distance from the substrate 110 increases in the Z direction.

According to some embodiments, to form the improper-fraction type capping layer 154, the conditions for depositing an insulative material used to form the improper-fraction type capping layer 154 may be controlled. For example, by employing a process condition having a relatively degraded step coverage during a process of depositing the insulative material used to form the improper-fraction type capping layer 154, the improper-fraction type capping layer 154 is formed to have a relatively small thickness on portions of the exposed surfaces of the resultant structure of FIG. 4K that are relatively close to the substrate 110, and the improper-fraction type capping layer 154 is formed to have a relatively large thickness on portions of the exposed surfaces of the resultant structure of FIG. 4K that are relatively far from the substrate 110. According to some embodiments, the improper-fraction type capping layer 154 may include, but is not limited to, silicon nitride ($Si_3N_4$), silicon carbonitride (SiCN), or a combination thereof.

According to some embodiments, after the improper-fraction type capping layer 154 is formed, a width in the horizontal direction of each of some regions of the plurality of landing pad spaces LPS may decrease as the distance from the substrate 110 increases. For example, as illustrated in (a-1) of FIG. 9, a width in the X direction of each landing pad space LPS defined by the improper-fraction type capping layer 154 over first insulation spacers 142A and second insulation spacers 142B may decrease as the distance from the substrate 110 increases. As illustrated in (a-2) of FIG. 9, a width in the Y direction of each landing pad space LPS defined by the improper-fraction type capping layer 154 over a conductive plug 150P may decrease as the distance from the substrate 110 increases.

As seen from (a-2) of FIG. 9, a width in the Y direction of the improper-fraction type capping layer 154 on a portion of each of sidewalls of the plurality of insulation fences 144B facing the landing pad spaces LPS may increase as the distance from the substrate 110 increases, and accordingly, sidewalls of the improper-fraction type capping layer 154 facing a landing pad space LPS may have an inclined shape at a negative slope to be closer to a vertical center axis (VCX) of the landing pad space LPS as the distance from the substrate 110 increases.

Referring to FIG. 4M, portions of the improper-fraction type capping layer 154 that cover the plurality of conductive plugs 150P are removed to expose respective upper surfaces of the plurality of conductive plugs 150P via the plurality of landing pad spaces LPS.

Figure 10:
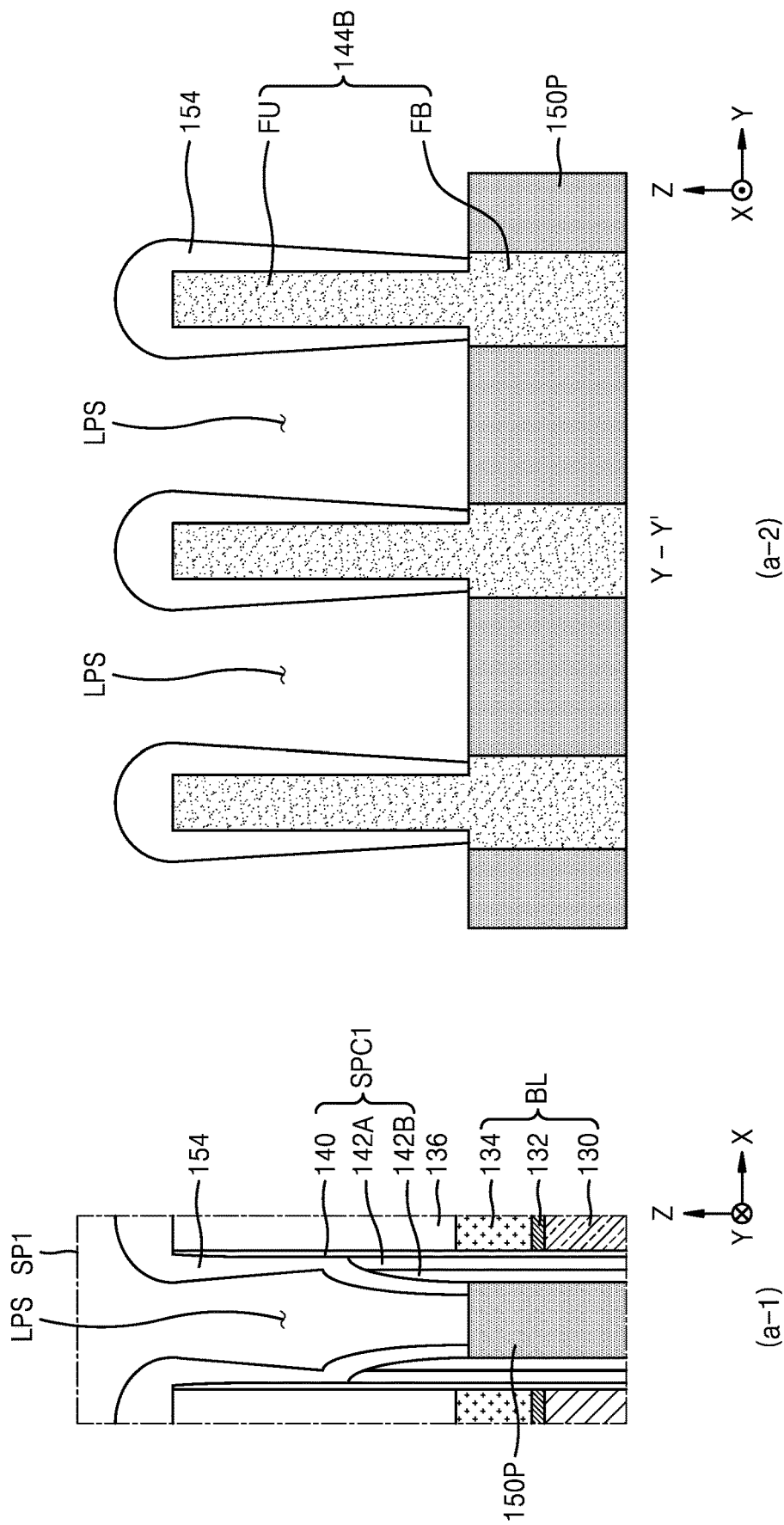

FIG. 10 is a cross-sectional view of an enlargement of some regions of a resultant structure of FIG. 4M. In FIG. 10, (a-1) is a magnified cross-sectional view of a dashed-dotted line region SP1 in (a) of FIG. 4M, and (a-2) is a magnified cross-sectional view of some components of a portion in the Y direction of the dashed-dotted line region SP1 in FIG. 4M, for example, a portion corresponding to the cross-section taken along line Y-Y' of FIG. 1.

Referring to FIGS. 4M and 10, a wet etch process may be used to remove a portion of the improper-fraction type capping layer 154 such that the respective upper surfaces of the plurality of conductive plugs 150P may be exposed via the plurality of landing pad spaces LPS. While the portion of the improper-fraction type capping layer 154 is being etched such that the respective upper surfaces of the plurality of conductive plugs 150P may be exposed, an upper surface of the improper-fraction type capping layer 154 may also be removed by a certain thickness, and thus the improper-fraction type capping layer 154 may have a decreased height.

According to some embodiments, an annealing process for curing damage to portions of the upper surfaces of the plurality of conductive plugs 150P exposed via the plurality of landing pad spaces LPS may be performed. The annealing process may use heat, plasma, or laser. The annealing process may be performed at about 600° C. to 1200° C., but the inventive concept is not limited thereto.

Referring to FIG. 4N, a plurality of metal silicide layers 172 are formed on the plurality of conductive plugs 150P exposed via the plurality of landing pad spaces LPS (see FIG. 4M), and the plurality of conductive landing pads LP are formed on the plurality of metal silicide layers 172 to fill the plurality of landing pad spaces LPS.

Figure 11:
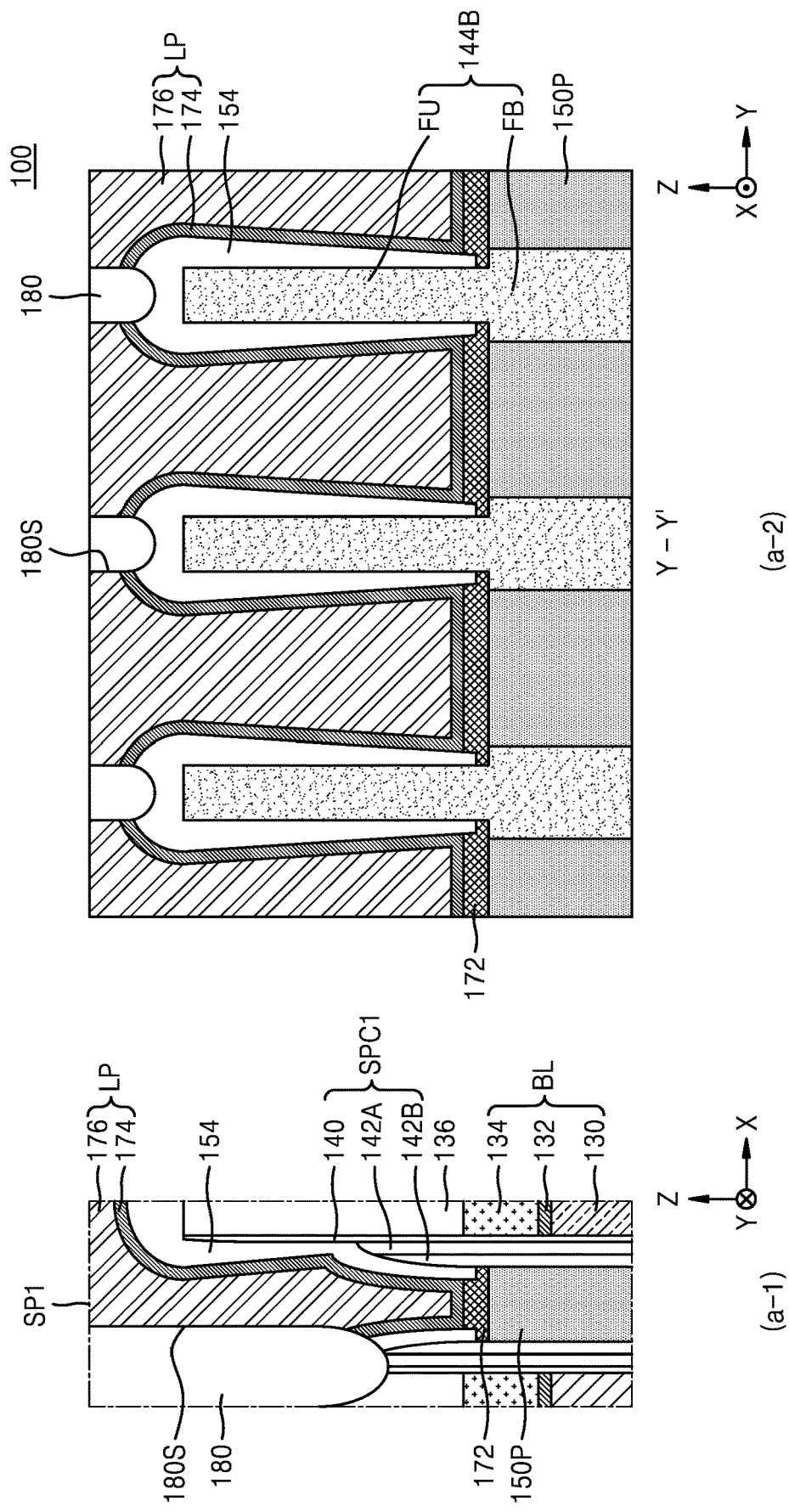

FIG. 11 is a cross-sectional view of an enlargement of some regions of a resultant structure of FIG. 4N. In FIG. 11, (a-1) is a magnified cross-sectional view of a dashed-dotted line region SP1 in (a) of FIG. 4N, and (a-2) is a magnified cross-sectional view of some components of a portion in the Y direction of the dashed-dotted line region SP1 in FIG. 4N, for example, a portion corresponding to the cross-section taken along line Y-Y' of FIG. 1.

Referring to FIGS. 4N and 11, the plurality of conductive landing pads LP may extend over the plurality of insulation capping patterns 136 and the improper-fraction type capping layer 154 so as to vertically overlap portions of the plurality of bit lines BL and a portion of the improper-fraction type capping layer 154, while filling the plurality of landing pad spaces LPS over the plurality of metal silicide layers 172. Each of the plurality of conductive landing pads LP may include a conductive barrier layer 174 and a conductive layer 176.

According to some embodiments, to form the plurality of conductive landing pads LP, after the conductive barrier layers 174 and the conductive layers 176 are sequentially formed to cover the entire surface of a resultant structure on which the metal silicide layers 172 are formed, a mask pattern (not shown) exposing respective portions of the conductive layers 176 may be formed on the conductive layers 176, and the conductive barrier layers 174, the conductive layers 176, and insulation layers around the conductive barrier layers 174 and the conductive layers 176 may be etched using the mask pattern as an etch mask. Each of the formed plurality of conductive landing pads LP includes remaining portions of the conductive barrier layers 174 and the conductive layers 176. The mask pattern may include, but is not limited to, a hard mask including a nitride layer, an oxide layer, a polysilicon layer, or a combination thereof. The plurality of conductive landing pads LP may be formed as a plurality of island patterns. When the conductive barrier layers 174, the conductive layers 176, and the insulation layers around the conductive barrier layers 174 and the conductive layers 176 are etched to form the plurality of conductive landing pads LP, a portion of the improper-fraction type capping layer 154, a portion of the plurality of insulation capping patterns 136, and a portion of each of the plurality of insulation spacers SPC1 may also be removed around the plurality of conductive landing pads LP, and thus the insulation spaces 180S exposing the sidewalls of the plurality of conductive landing pads LP may be provided around the plurality of conductive landing pads LP. According to some embodiments, as illustrated in FIG. 11, an interval between two conductive landing pads LP adjacent to each other in the Y direction from among the plurality of conductive landing pads LP may be less than that between two conductive landing pads LP adjacent to each other in the X direction from among the plurality of conductive landing pads LP. Accordingly, a depth (see (a-2) of FIG. 11) of an insulation space 180S between the two conductive landing pads LP adjacent to each other in the Y direction may be less than a depth (see (a) of FIG. 4N) of an insulation space 180S between the two conductive landing pads LP adjacent to each other in the X direction.

The insulation spaces 180S around the plurality of conductive landing pads LP may be filled with the insulation layer 180, electrically insulating the plurality of conductive landing pads LP from each other. A lower surface level of the insulation layer 180 may vary according to locations on the substrate 110. As illustrated in FIG. 2B, a level of a lower surface of a portion of the insulation layer 180 that vertically overlaps each insulation fence 144B may be higher than that of a lower surface of a portion of the insulation layer 180 that vertically overlaps each insulation capping pattern 136.

Thereafter, a plurality of capacitor lower electrodes capable of being electrically connected to the plurality of conductive landing pads LP may be formed on the insulation layer 180.

According to some embodiments, in the processes described above with reference to FIGS. 4N and 11, after the plurality of conductive landing pads LP are formed and before the insulation spaces 180S are filled with the insulation layer 180, respective portions of the plurality of insulation spacers SPC1 (e.g., the plurality of first insulation spacers 142A) may be removed via wet etching, and thus at least a portion of each of the plurality of first insulation spacers 142A may be substituted with an air spacer. Thereafter, the insulation spaces 180S may be filled with the insulation layer 180 to define respective upper limits of the air spacers. Consequently, structures each including an air spacer between an insulation liner 140 and a second insulation spacer 142B may be formed between a bit line BL and a conductive plug 150P and between the bit line BL and a conductive landing pad LP, respectively.

According to the method of manufacturing the IC device 100 described above with reference to FIGS. 4A through 11, before the plurality of metal silicide layers 172 and the plurality of conductive landing pads LP are formed, an insulation structure including each insulation capping pattern 136 and the improper-fraction type capping layer 154 may be formed on each bit line BL, and thus a minimum CD in the horizontal direction required by an insulation structure covering an upper surface of the bit line BL may be easily secured. Accordingly, even when portions of the insulation capping patterns 136 and the improper-fraction type capping layer 154 are consumed as neighboring layers of each of the insulation capping patterns 136 and the improper-fraction type capping layer 154 are being etched in a subsequent process, because a sufficient insulation space is secured between the plurality of bit lines BL, the plurality of metal silicide layers 172, the plurality of conductive landing pads LP, and other conductive patterns by the insulation capping patterns 136 and the improper-fraction type capping layer 154, occurrence of an unwanted short circuit may be prevented. Moreover, because the improper-fraction type capping layer 154 is further formed on the insulation spacers SPC1 covering respective both sidewalls of the plurality of bit lines BL, after the plurality of conductive landing pads LP are formed in the landing pad spaces LPS between two adjacent bit lines BL, a sufficient insulation distance may be secured between the plurality of conductive landing pads LP and the bit lines BL adjacent thereto. Accordingly, occurrence of an unwanted short circuit between each conductive landing pad LP and each bit line BL may be prevented.

FIGS. 12A through 15B are cross-sectional views for explaining a method of manufacturing an IC device, according to other embodiments of the inventive concept. FIGS. 12A, 13A, 14A, and 15A are cross-sectional views of some components of portions corresponding to the cross-section taken along line A-A' of FIG. 1, respectively, and FIGS. 12B, 13B, 14B, and 15B are cross-sectional views of some components of resultant structures obtained in the respective processes of FIGS. 12A, 13A, 14A, and 15A, respectively. In FIGS. 12B, 13B, 14B, and 15B, (a-1) is a magnified cross-sectional view of a dashed-dotted line region SP2 in FIGS. 12A, 13A, 14A, and 15A, and (a-2) is a magnified cross-sectional view of some components of a portion in the Y direction of the dashed-dotted line region SP2 in FIGS. 12A, 13A, 14A, and 15A, for example, a portion corresponding to the cross-section taken along line Y-Y' of FIG. 1. A method of manufacturing the IC device 200 of FIGS. 3A and 3B will now be described with reference to FIGS. 12A through 15B.

Figure 12A:
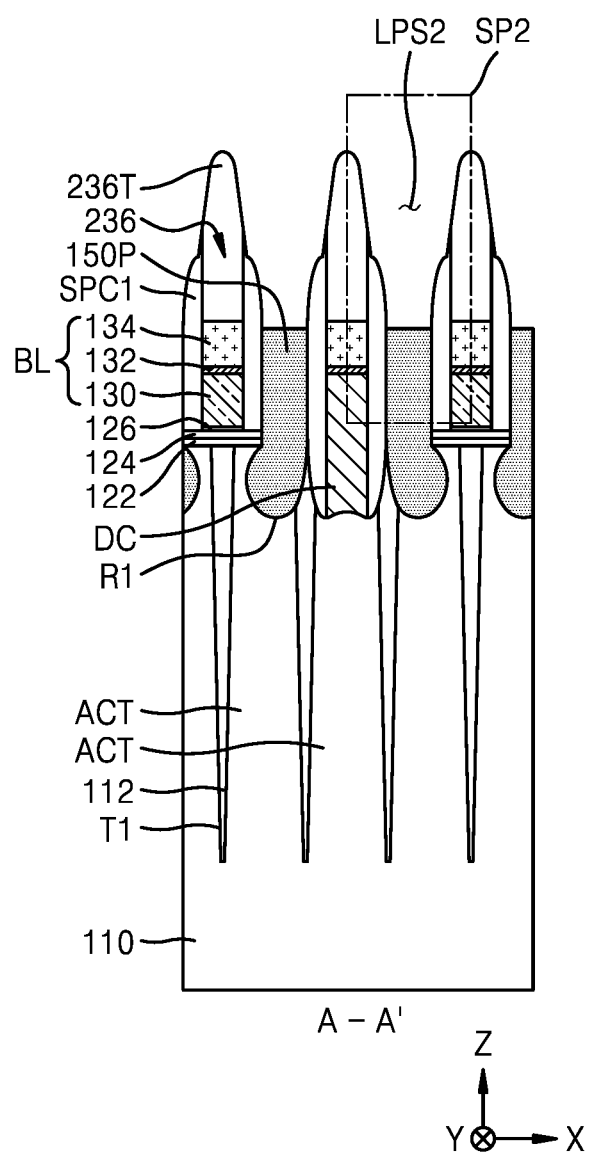

Referring to FIGS. 12A and 12B, according to a method similar to that described above with reference to FIGS. 4A through 4K and FIGS. 6 through 8, the plurality of upper contact spaces UCS having increased widths are formed by partially removing the plurality of insulation spacers SPC1, the plurality of conductive plugs 150P are formed by removing respective portions of the plurality of preliminary conductive plugs 150 exposed via the plurality of upper contact spaces UCS, and a plurality of landing pad spaces LPS2 are formed on respective upper surfaces of the plurality of conductive plugs 150P. However, in the present embodiment, when a process of etching the second insulation spacers 142B and the first insulation spacers 142A from the resultant structure of FIGS. 4I and 6 is performed to form the plurality of upper contact spaces UCS and when a process of etching the plurality of preliminary conductive plugs 150 from the resultant structure of FIGS. 4J and 7 is performed to form the plurality of landing pad spaces LPS2, respective portions of the insulation liners 140, the insulation capping patterns 136, and the insulation fences 144B exposed via the plurality of upper contact spaces UCS are also removed by controlling etch selectivity, thereby forming the insulation capping patterns 236 each having the peak-type capping top 236T and the insulation fences 244B each having a peak-type fence top 244T. Each of the insulation fences 244B may include the fence base FB, the fence upper portion FU, and the peak-type fence top 244T.

The peak-type capping top 236T of the insulation capping pattern 236 may have a shape in which a width in the X direction gradually decreases as the distance from the substrate 110 increases. The peak-type fence top 244T of the insulation fence 244B may have a shape in which a width in the Y direction gradually decreases as the distance from the substrate 110 increases. Accordingly, the width in the X direction and the width in the Y direction of each of the landing pad spaces LPS2 defined by the plurality of insulation capping patterns 236 and the plurality of insulation fences 244B may increase in a direction from the substrate 110 to an entrance side.

Figure 13A:
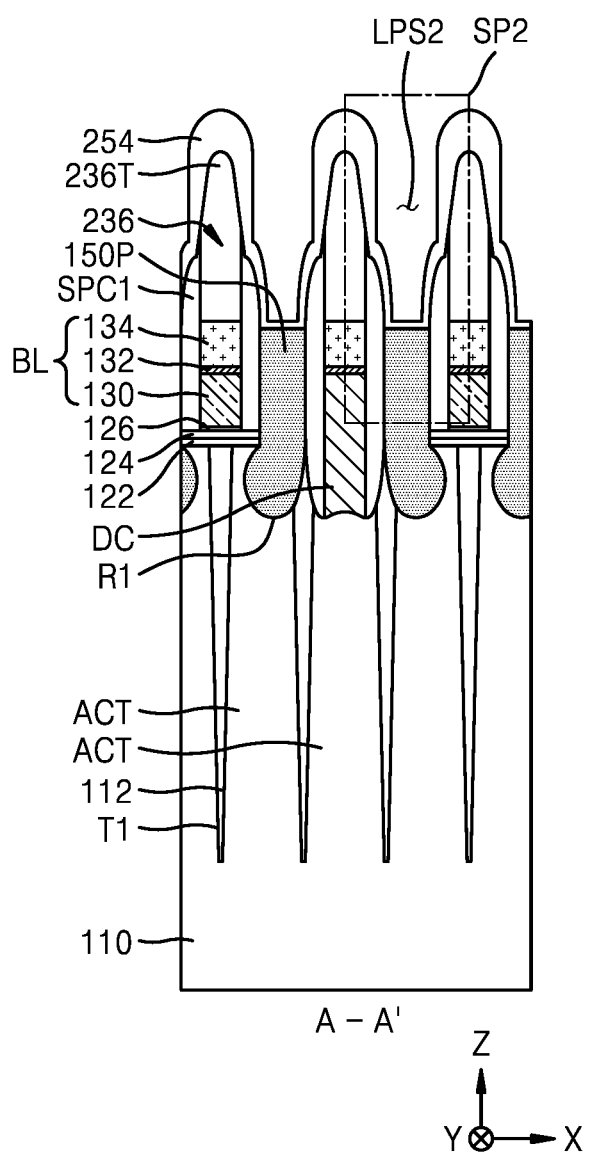
Figure 13B:
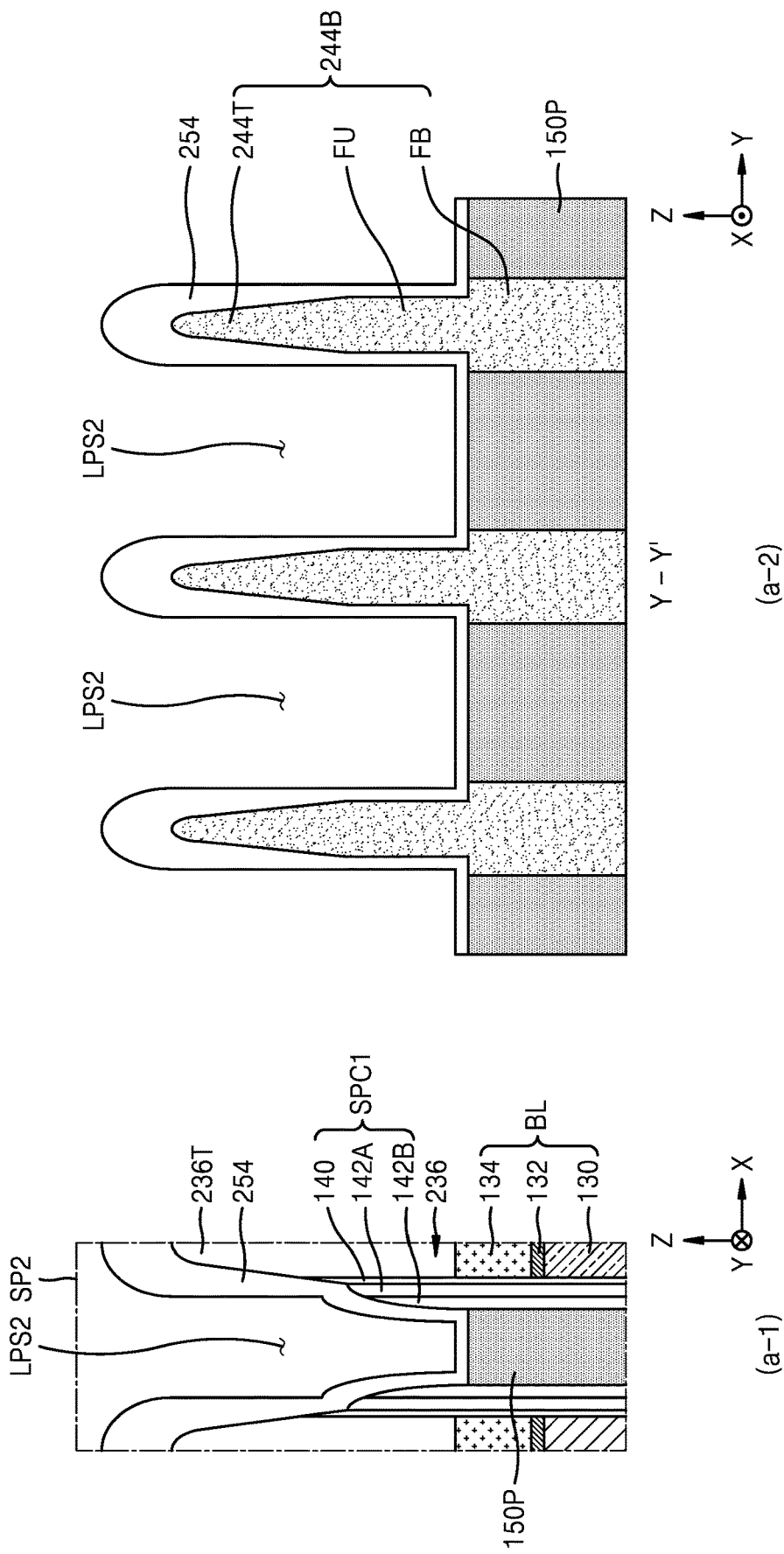

Referring to FIGS. 13A and 13B, according to a method similar to that described above with reference to FIGS. 4L and 9, the improper-fraction type capping layer 254 covering the plurality of insulation capping patterns 236 and the plurality of insulation fences 244B is formed on a resultant structure of FIGS. 12A and 12B in which the plurality of landing pad spaces LPS2 are formed.

The improper-fraction type capping layer 254 may increase in a width in the horizontal direction as the distance from the substrate 110 increases, on sidewalls of the plurality of insulation capping patterns 236 and sidewalls of the plurality of insulation fences 244B. For example, on the sidewall of the peak-type capping top 236T of each of the plurality of insulation capping patterns 236, the improper-fraction type capping layer 254 may increase in a width in the X direction as the distance from the substrate 110 increases. On the sidewall of the peak-type fence top 244T of each of the plurality of insulation fences 2144B, the improper-fraction type capping layer 254 may increase in a width in the Y direction as the distance from the substrate 110 increases. A detailed description of the formation of the improper-fraction type capping layer 254 is the same as that of the improper-fraction type capping layer 154 given with reference to FIG. 4L.

According to the present embodiment, unlike the embodiment of FIGS. 4L and 9, upper portions of the plurality of peak-type insulation capping patterns 236 and upper portions of the plurality of peak-type insulation fences 244B decrease in a width in the horizontal direction as the distance from the substrate 110 increases. Accordingly, even when the width in the horizontal direction of the improper-fraction type capping layer 254 increases with distance from the substrate 110, the width in the horizontal direction of each of the plurality of landing pad spaces LPS2 after the improper-fraction type capping layer 254 is formed may not decrease with distance from the substrate 110. According to some embodiments, according to the widths in the horizontal direction of the upper portions of the plurality of peak-type insulation capping patterns 236 and the upper portions of the plurality of peak-type insulation fences 244B, the width in the horizontal direction of each of the plurality of landing pad spaces LPS2 may have no substantial variations, gradually decrease, or gradually increase with distance from the substrate 110.

Figure 14A:
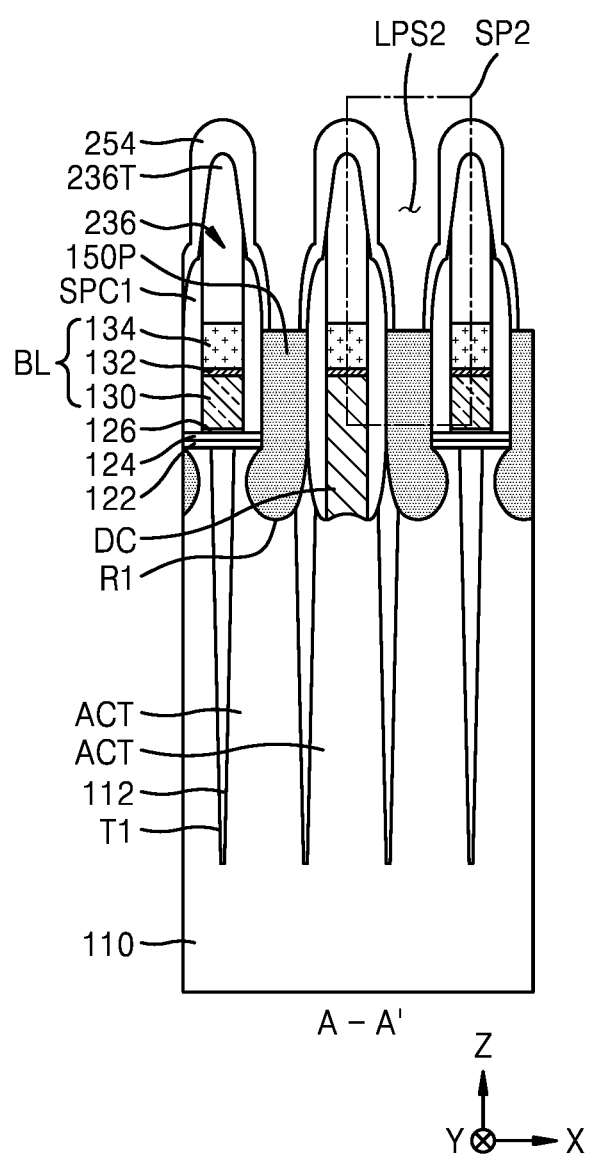
Figure 14B:
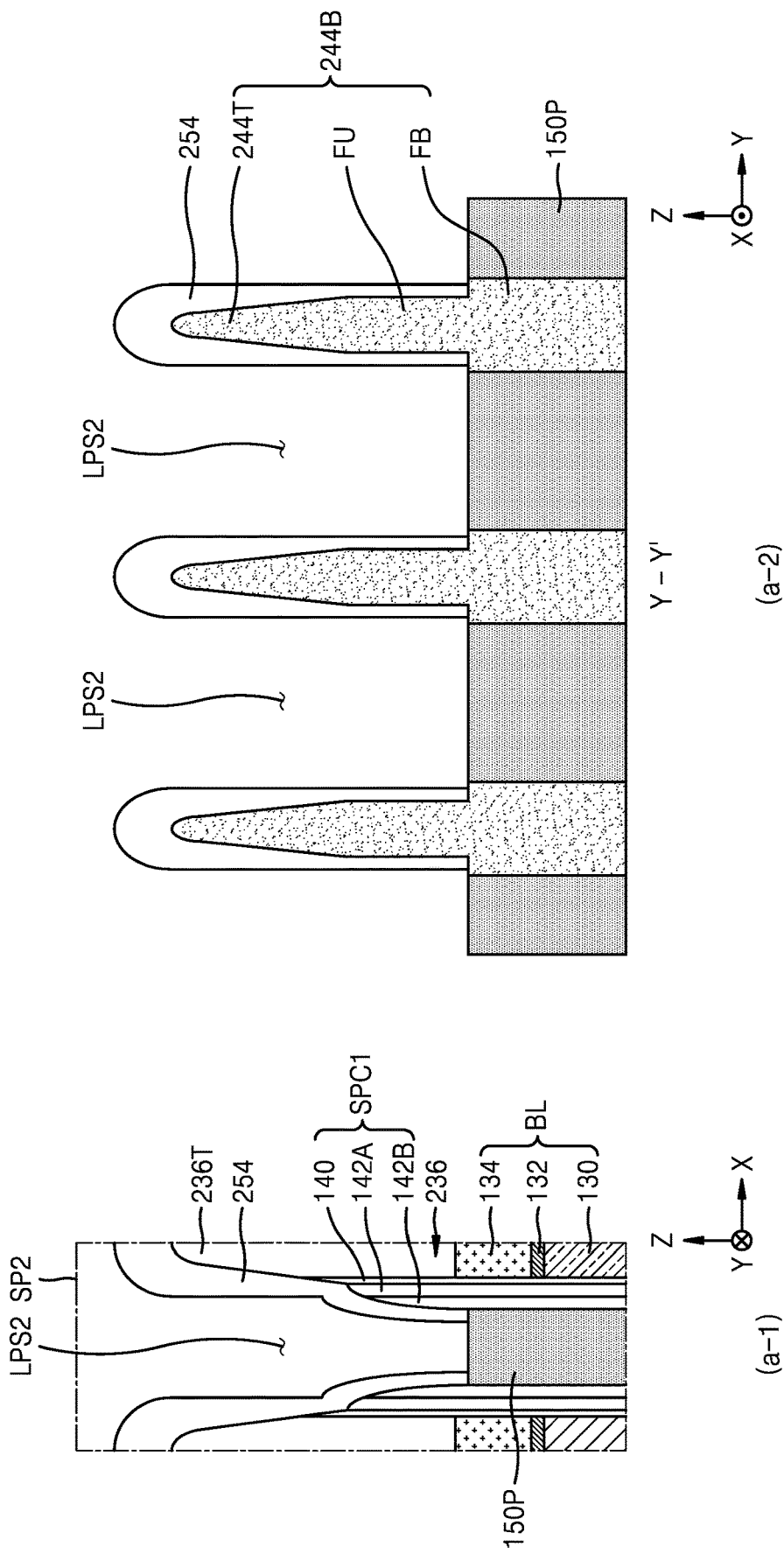

Referring to FIGS. 14A and 14B, according to a method similar to that described above with reference to FIGS. 4M and 10, portions of the improper-fraction type capping layer 254 that cover the plurality of conductive plugs 150P are removed to expose the respective upper surfaces of the plurality of conductive plugs 150P via the plurality of landing pad spaces LPS2.

Figure 15A:
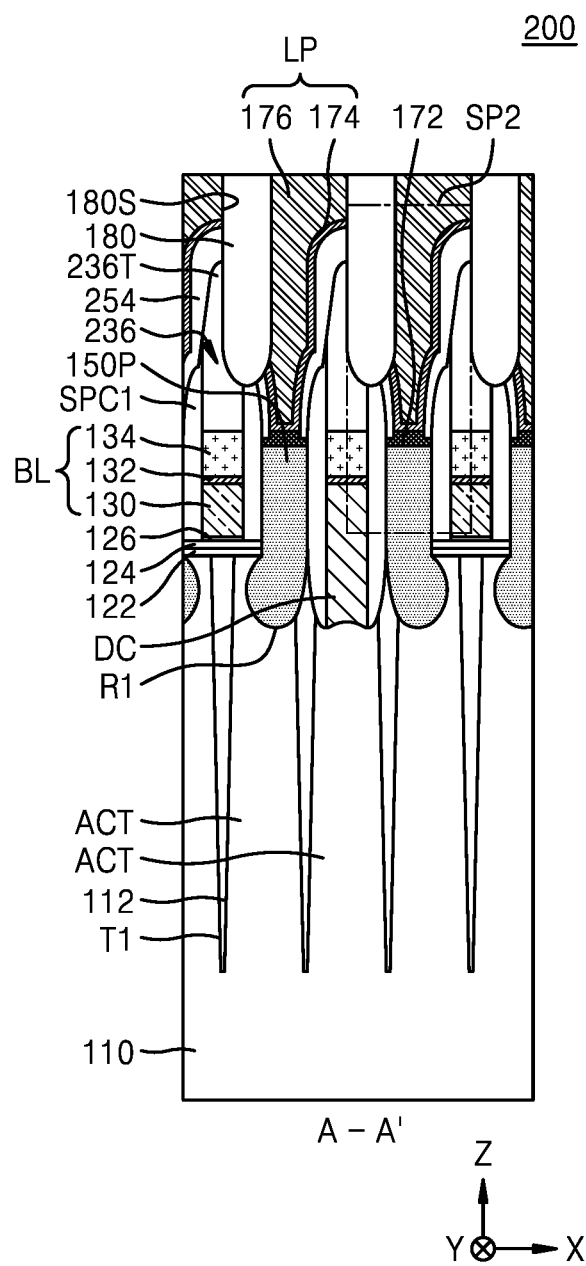
Figure 15B:
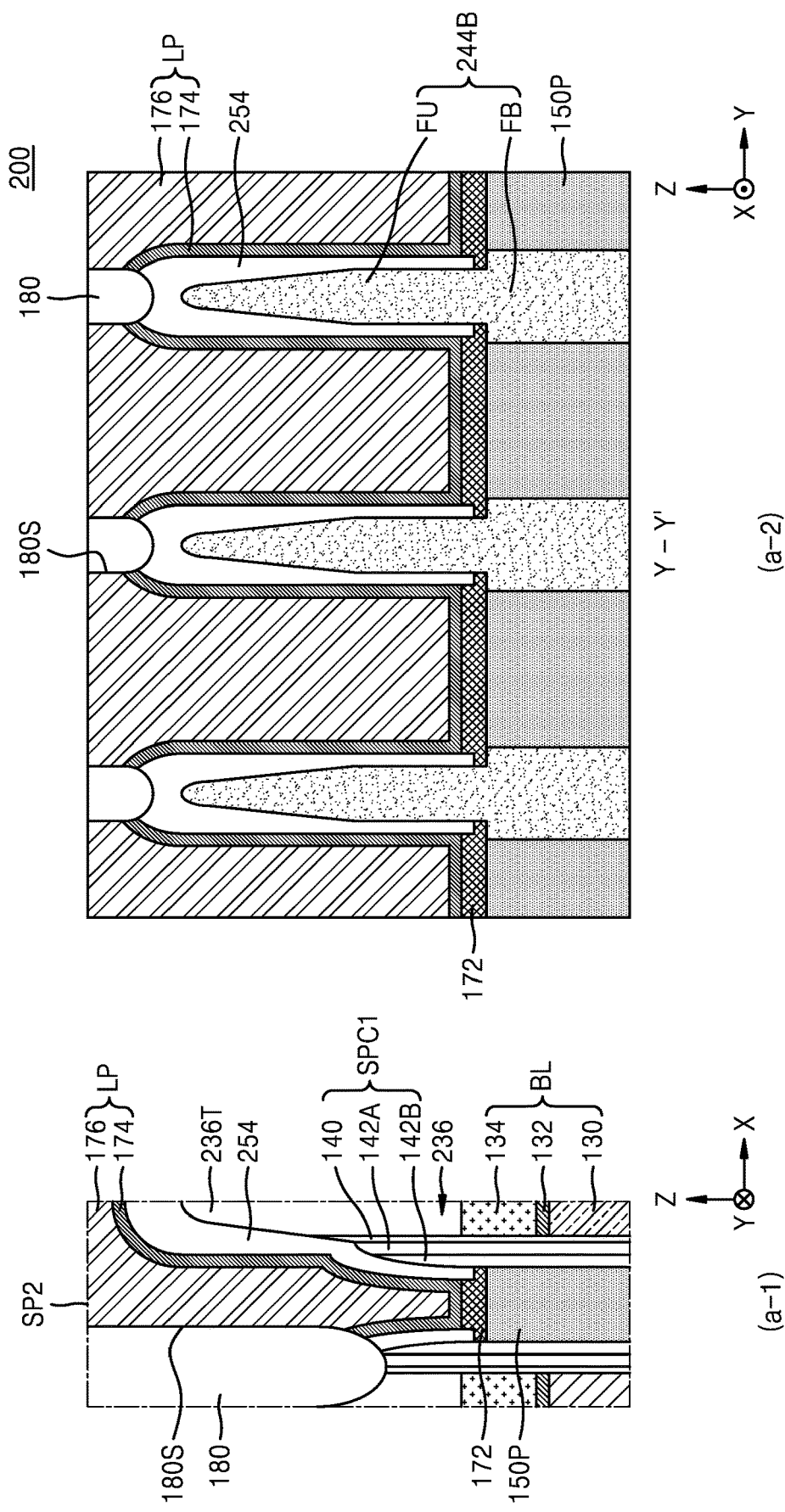

Referring to FIGS. 15A and 15B, in a method similar to that described above with reference to FIGS. 4N and 11, the plurality of metal silicide layers 172 are formed on the plurality of conductive plugs 150P exposed via the plurality of landing pad spaces LPS2, the plurality of conductive landing pads LP are formed on the plurality of metal silicide layers 172, and the insulation layer 180 is formed to fill the insulation spaces 180S around the plurality of conductive landing pads LP. Thereafter, a plurality of capacitor lower electrodes capable of being electrically connected to the plurality of conductive landing pads LP may be formed on the insulation layer 180.

According to the method of manufacturing the IC device 200 described above with reference to FIGS. 12A through 15B, even when each peak-type insulation capping pattern 236 including the peak-type capping top 236T having the width in the X direction less than the width in the X direction of each bit line BL is formed on the bit line BL, the improper-fraction type capping layer 254 of which the width in the horizontal direction increases with distance from the substrate 110 is formed on the peak-type insulation capping pattern 236, and thus a minimum CD in the horizontal direction required by an insulation structure covering an upper surface of the bit line BL may be secured. Accordingly, even when portions of the improper-fraction type capping layer 254 and the peak-type insulation capping patterns 236 are consumed as neighboring layers of each of the improper-fraction type capping layer 254 and the peak-type insulation capping patterns 236 are being etched in a subsequent process, because a sufficient insulation space is secured between the plurality of conductive landing pads LP around the peak-type insulation capping patterns 236 and the improper-fraction type capping layer 254 or between other conductive patterns by the peak-type insulation capping patterns 236 and the improper-fraction type capping layer 254, occurrence of an unwanted short circuit may be prevented. Moreover, because the insulation spacers SPC1 covering respective both sidewalls of the plurality of bit lines BL are covered by the improper-fraction type capping layer 254, after the plurality of metal silicide layers 172 and the plurality of conductive landing pads LP are formed in the landing pad spaces LPS2 between two adjacent bit lines BL, a sufficient insulation distance may be secured between the plurality of metal silicide layers 172 and the plurality of conductive landing pads LP and the bit lines BL adjacent thereto. Accordingly, occurrence of an unwanted short circuit between each conductive landing pad LP and each bit line BL may be prevented.

While the inventive concept has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit (IC) device comprising:
   a line structure comprising a conductive line formed on a substrate and an insulation capping pattern that covers the conductive line;
   an insulation spacer covering a sidewall of the line structure;
   a conductive plug spaced apart from the conductive line in a first horizontal direction with the insulation spacer between the conductive plug and the conductive line;
   a conductive landing pad arranged on the conductive plug to vertically overlap the conductive plug;
   a metal silicide layer interposed between the conductive plug and the conductive landing pad and spaced apart from the conductive line, and a capping layer comprising a first portion between the conductive landing pad and the insulation capping pattern and a third portion below the first portion, wherein the first portion of the capping layer has a shape between the conductive landing pad and the insulation capping pattern in which a width in the first horizontal direction gradually increases as a distance from the substrate increases in a vertical direction, and wherein a bottom surface of the third portion of the capping layer is at a vertical level lower than a top surface of the metal silicide layer and higher than a bottom surface of the metal silicide layer.

2. The IC device of claim 1, further comprising:

an insulation fence spaced apart from the conductive line in the first horizontal direction and covering a sidewall of the conductive plug in a second horizontal direction perpendicular to the first horizontal direction, wherein the insulation spacer is formed between the insulation fence and the conductive line, wherein the capping layer further comprises a second portion interposed between the conductive landing pad and the insulation fence, and wherein the second portion has a shape in which a width in the second horizontal direction gradually increases as the distance from the substrate increases in the vertical direction.

3. The IC device of claim 1, wherein the third portion of the capping layer further is interposed between the conductive landing pad and the insulation spacer, and wherein a width of the first portion in the first horizontal direction is greater than a width of the third portion in the first horizontal direction.

4. The IC device of claim 1, wherein the conductive landing pad comprises a portion having a width in a horizontal direction that gradually decreases as the distance from the substrate increases.

5. The IC device of claim 1, wherein the insulation spacer and the capping layer are between the metal silicide layer and the conductive line.

6. The IC device of claim 5, wherein the third portion of the capping layer further is interposed between the conductive landing pad and the insulation spacer, and wherein the third portion of the capping layer is spaced apart from the conductive plug, and the metal silicide layer is between the third portion and the conductive plug.

7. The IC device of claim 1, wherein the insulation capping pattern comprises a peak-type capping top having a shape in which a width in the first horizontal direction gradually decreases as the distance from the substrate increases in the vertical direction, and wherein the first portion of the capping layer is interposed between the conductive landing pad and the peak-type capping top.

8. An integrated circuit (IC) device comprising:

a pair of line structures comprising a pair of conductive lines extending parallel to each other on a substrate and being adjacent to each other in a first horizontal direction and a pair of insulation capping patterns covering the pair of conductive lines;

a conductive plug interposed between the pair of line structures;

a conductive landing pad arranged on the conductive plug between the pair of line structures;

a metal silicide layer interposed between the conductive plug and the conductive landing pad and spaced apart from the pair of conductive lines, and a capping layer comprising a first portion between one of the pair of line structures and the conductive landing pad and a third portion below the first portion, wherein the first portion of the capping layer has a shape between the one of the pair of line structures and the conductive landing pad in which a width in the first horizontal direction gradually increases as a distance from the substrate increases in a vertical direction, and wherein a bottom surface of the third portion of the capping layer is at a vertical level lower than a top surface of the metal silicide layer and higher than a bottom surface of the metal silicide layer.

9. The IC device of claim 8, wherein the conductive landing pad comprises a first sidewall facing the first portion of the capping layer, and wherein a separation distance between the first sidewall and one of the pair of insulation capping patterns gradually increases as the distance from the substrate increases in the vertical direction.

10. The IC device of claim 8, further comprising:

an insulation fence interposed between the pair of line structures and covering a sidewall of the conductive plug in a second horizontal direction perpendicular to the first horizontal direction, wherein the capping layer further comprises a second portion between the conductive landing pad and the insulation fence, and wherein the second portion has a shape in which a width in the second horizontal direction gradually increases as the distance from the substrate increases in the vertical direction.

11. The IC device of claim 8, further comprising:

an insulation fence interposed between the pair of line structures and contacting a sidewall of the conductive plug, wherein the conductive landing pad comprises a second sidewall facing a second portion of the capping layer, and wherein a separation distance between the second sidewall and the insulation fence gradually increases as the distance from the substrate increases in the vertical direction.

12. The IC device of claim 8, further comprising:

an insulation spacer between the one of the pair of line structures and the conductive landing pad, wherein the third portion of the capping layer is interposed between the conductive landing pad and the insulation spacer, and wherein a width of the first portion in the first horizontal direction is greater than a width of the third portion in the first horizontal direction.

13. The IC device of claim 12, wherein the third portion of the capping layer is interposed between the one of the pair of line structures and the conductive landing pad.

14. The IC device of claim 12, wherein the insulation spacer comprises an oxide layer, a nitride layer, an air spacer, or a combination thereof.

15. The IC device of claim 8, wherein each of the pair of insulation capping patterns comprises a peak-type capping top having a shape in which a width in the first horizontal direction gradually decreases as the distance from the substrate increases in the vertical direction, and wherein the first portion of the capping layer is interposed between the conductive landing pad and the peak-type capping top.

16. The IC device of claim 8, further comprising:

an insulation spacer between the one of the pair of line structures and the conductive plug and between the one of the pair of line structures and the conductive landing pad, wherein each of the pair of conductive lines is spaced apart from the conductive landing pad and the insulation spacer and the capping layer are between each of the pair of conductive lines and the conductive landing pad.

17. The IC device of claim 8, further comprising:

an insulation spacer between the one of the pair of line structures and the conductive plug and between the one of the pair of line structures and the conductive landing pad, wherein each of the pair of conductive lines is spaced apart from the metal silicide layer and the insulation spacer and the capping layer are between each of the pair of conductive lines and the metal silicide layer.

18. An integrated circuit (IC) device comprising:

a pair of line structures comprising a pair of conductive lines extending parallel to each other on a substrate and being adjacent to each other in a first horizontal direction and a pair of insulation capping patterns covering the pair of conductive lines;

a plurality of contact structures interposed between the pair of line structures and aligned in a second horizontal direction perpendicular to the first horizontal direction;

a plurality of insulation fences alternating with the plurality of contact structures between the pair of line structures such that one insulation fence is between two adjacent contact structures; and a capping layer comprising a first portion between one of the pair of line structures and one of the plurality of contact structures and a third portion below the first portion, wherein each of the plurality of contact structures comprises a metal silicide layer, wherein a bottom surface of the third portion of the capping layer is at a vertical level lower than a top surface of the metal silicide layer and higher than a bottom surface of the metal silicide layer, and wherein the first portion of the capping layer has a shape between the one of the pair of line structures and the plurality of contact structures in which a width in the first horizontal direction gradually increases as a distance from the substrate increases in a vertical direction.

19. The IC device of claim 18, wherein the capping layer further comprises a second portion between one of the plurality of contact structures and one of the plurality of insulation fences, and wherein the second portion has a shape in which a width in the second horizontal direction gradually increases as the distance from the substrate increases in the vertical direction.

20. The IC device of claim 18, wherein each of the plurality of contact structures further comprises a conductive plug interposed between the pair of conductive lines and a conductive landing pad interposed between the pair of insulation capping patterns, wherein the metal silicide layer is interposed between the conductive plug and the conductive landing pad, and wherein the conductive landing pad comprises a portion having a width in the second horizontal direction that gradually decreases as the distance from the substrate increases.

* * * * *